(12) United States Patent
Feng

(10) Patent No.: US 11,127,326 B2
(45) Date of Patent: Sep. 21, 2021

(54) SHIFT REGISTER UNIT, METHOD FOR DRIVING SHIFT REGISTER UNIT, GATE DRIVE CIRCUIT, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Xuehuan Feng, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/630,247

(22) PCT Filed: Aug. 20, 2019

(86) PCT No.: PCT/CN2019/101501
§ 371 (c)(1),
(2) Date: Jan. 10, 2020

(87) PCT Pub. No.: WO2020/038346
PCT Pub. Date: Feb. 27, 2020

(65) Prior Publication Data
US 2021/0065599 A1    Mar. 4, 2021

(30) Foreign Application Priority Data
Aug. 21, 2018   (CN) .......................... 201810953785.2

(51) Int. Cl.
*G09G 3/20*         (2006.01)
*G11C 19/28*        (2006.01)

(52) U.S. Cl.
CPC ............... *G09G 3/20* (2013.01); *G11C 19/28* (2013.01); *G09G 2300/0809* (2013.01);
(Continued)

(58) Field of Classification Search
CPC ...... G09G 3/20; G09G 3/3266; G09G 3/3674; G09G 3/3677; G09G 2300/0809;
(Continued)

(56) References Cited

U.S. PATENT DOCUMENTS 8,907,882 B2 * 12/2014 Miyamoto ............. G11C 19/28
345/94
2012/0139883 A1   6/2012 Lee
(Continued)

FOREIGN PATENT DOCUMENTS

CN    104795106 A    7/2015
CN    106652875      5/2017
(Continued)

*Primary Examiner* — Tom V Sheng
(74) *Attorney, Agent, or Firm* — Banner & Witcoff, Ltd.

(57) ABSTRACT

A shift register unit, a method for driving a shift register unit, a gate drive circuit, and a display device are provided. The shift register unit includes a display circuit, and the display circuit is configured to provide a drive scanning signal to a corresponding gate line in a display phase, and the display circuit includes a first control circuit and a first bias control circuit. The first control circuit is configured to perform noise reduction on an output terminal of the display circuit under control of a level of the first node. The first bias control circuit is configured to transmit a first reference voltage signal provided by the first reference voltage signal terminal to the first node under control of a first clock signal provided by the first clock signal terminal, thereby turning off the first control circuit by controlling the level of the first node in a non-display phase.

20 Claims, 10 Drawing Sheets

(52) U.S. Cl.
CPC ............... *G09G 2310/0267* (2013.01); *G09G 2310/0286* (2013.01); *G09G 2320/043* (2013.01)

(58) Field of Classification Search
CPC ... G09G 2310/0267; G09G 2310/0286; G09G 2320/043; G11C 19/28
USPC .......................................................... 345/214
See application file for complete search history.

(56) References Cited

U.S. PATENT DOCUMENTS

| | | | |
|---|---|---|---|
| 2017/0193957 A1* | 7/2017 | Liu | G11C 19/28 |
| 2017/0221411 A1* | 8/2017 | Chang | G09G 3/36 |
| 2018/0047327 A1* | 2/2018 | Wang | G11C 19/184 |
| 2019/0073987 A1* | 3/2019 | Lin | G09G 5/393 |
| 2019/0333595 A1* | 10/2019 | Zou | G11C 19/287 |
| 2019/0340969 A1* | 11/2019 | Hu | G09G 3/3266 |
| 2020/0051507 A1* | 2/2020 | Feng | G09G 3/3266 |
| 2020/0152283 A1* | 5/2020 | Qing | G09G 3/3225 |

FOREIGN PATENT DOCUMENTS

| | | |
|---|---|---|
| CN | 107845403 | 3/2018 |
| CN | 108346397 A | 7/2018 |
| CN | 108962330 | 12/2018 |

* cited by examiner in the display phase, the first control circuit performing noise reduction on the output terminal of the display circuit under control of the level of the first node, and the first bias control circuit being turned off under control of the first clock signal — S10 in the non-display phase, the first bias control circuit being turned on under control of the first clock signal and transmitting the first reference voltage signal to the first node, thereby turning off the first control circuit — S20

FIG. 7

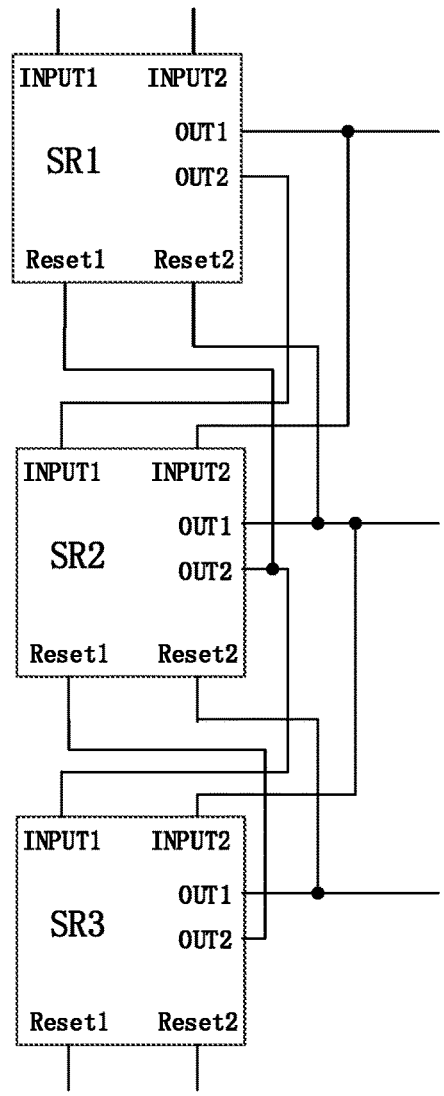

FIG. 8

SHIFT REGISTER UNIT, METHOD FOR DRIVING SHIFT REGISTER UNIT, GATE DRIVE CIRCUIT, AND DISPLAY DEVICE

The application is a U.S. National Phase Entry of International Application No. PCT/CN2019/101501 filed on Aug. 20, 2019, designating the United States of America and claiming priority to Chinese Patent Application No. 201810953785.2, filed on Aug. 21, 2018. The present application claims priority to and the benefit of the above-identified applications and the above-identified applications are incorporated by reference herein in their entirety.

TECHNICAL FIELD

Embodiments of the present disclosure relate to a shift register unit, a method for driving a shift register unit, a gate drive circuit, and a display device.

BACKGROUND

In a flat display panel, gate scanning signals are provided to gate electrodes of thin film transistors (TFTs) in a pixel region through a gate drive circuit. The gate drive circuit can be formed on an array substrate of the flat display panel through an array process, that is, a gate driver on array (GOA) process. This integration process not only saves costs, but also can achieve a beautiful design that both sides of the flat display panel are symmetrical. Moreover, a bonding area of the gate integrated circuit (IC) and a fan-out wiring space are also omitted, so that the design of a narrow frame can be achieved.

SUMMARY

At least one embodiment of the present disclosure provides a shift register unit, the shift register unit comprises a display circuit, the display circuit is configured to provide a drive scanning signal to a corresponding gate line in a display phase, and the display circuit comprises a first control circuit and a first bias control circuit; the first control circuit is connected to a first node, and is configured to perform noise reduction on an output terminal of the display circuit under control of a level of the first node; and the first bias control circuit is connected to a first clock signal terminal, a first reference voltage signal terminal, and the first node, and is configured to transmit a first reference voltage signal provided by the first reference voltage signal terminal to the first node under control of a first clock signal provided by the first clock signal terminal, thereby turning off the first control circuit by controlling the level of the first node in a non-display phase.

For example, the shift register unit provided by an embodiment of the present disclosure further comprises a detection circuit, the detection circuit is configured to provide a detection scanning signal to the corresponding gate line in the non-display phase, and the detection circuit comprises a detection output circuit, a second control circuit, and a second bias control circuit; the detection output circuit comprises a first control terminal and an output terminal, and the detection output circuit is connected to a second clock signal terminal, and is configured to output a second clock signal provided by the second clock signal terminal to the output terminal of the detection output circuit under control of a level of the first control terminal of the detection output circuit; the second control circuit is connected to a second node and the first control terminal of the detection output circuit, and is configured to control the level of the first control terminal of the detection output circuit under control of a level of the second node; and the second bias control circuit is connected to the first clock signal terminal, the first reference voltage signal terminal, and the second node, and is configured to transmit the first reference voltage signal to the second node under control of the first clock signal, thereby turning off the second control circuit by controlling the level of the second node in the non-display phase.

For example, in the shift register unit provided by an embodiment of the present disclosure, the first bias control circuit comprises a first transistor, the first control circuit comprises a second transistor and a third transistor, and the output terminal of the display circuit comprises a first signal output terminal and a second signal output terminal; a gate electrode of the first transistor is connected to the first clock signal terminal, a first electrode of the first transistor is connected to the first node, and a second electrode of the first transistor is connected to the first reference voltage signal terminal; a gate electrode of the second transistor is connected to the first node, a first electrode of the second transistor is connected to the second signal output terminal, and a second electrode of the second transistor is connected to the first clock signal terminal; and a gate electrode of the third transistor is connected to the first node, a first electrode of the third transistor is connected to the first signal output terminal, and a second electrode of the third transistor is connected to the first clock signal terminal.

For example, in the shift register unit provided by an embodiment of the present disclosure, the second bias control circuit comprises a fourth transistor, the second control circuit comprises a fifth transistor, and the detection output circuit comprises a sixth transistor; a gate electrode of the fourth transistor is connected to the first clock signal terminal, a first electrode of the fourth transistor is connected to the second node, and a second electrode of the fourth transistor is connected to the first reference voltage signal terminal; a gate electrode of the fifth transistor is connected to the second node, a first electrode of the fifth transistor is connected to a gate electrode of the sixth transistor, and a second electrode of the fifth transistor is connected to the first clock signal terminal; and the gate electrode of the sixth transistor serves as the first control terminal of the detection output circuit, a first electrode of the sixth transistor is connected to the second clock signal terminal, and a second electrode of the sixth transistor serves as the output terminal of the detection output circuit and is connected to the first signal output terminal.

For example, in the shift register unit provided by an embodiment of the present disclosure, the first clock signal is a first level signal in the display phase, the first clock signal is a second level signal in the non-display phase, and the first level signal is different from the second level signal.

For example, in the shift register unit provided by an embodiment of the present disclosure, the display circuit further comprises a display input circuit and a display output circuit; the display input circuit is connected to a first input signal terminal, a third clock signal terminal, and a third node, and is configured to input a first input signal provided by the first input signal terminal to the third node in response to a third clock signal provided by the third clock signal terminal; the display output circuit is connected to the third node and a fourth clock signal terminal, and is configured to output a fourth clock signal provided by the fourth clock signal terminal to the first signal output terminal and the second signal output terminal under control of a level of the third node; and the first bias control circuit is further connected to the third node, and is further configured to transmit the first reference voltage signal to the third node under control of the first clock signal.

For example, in the shift register unit provided by an embodiment of the present disclosure, the display input circuit comprises a seventh transistor, the first bias control circuit further comprises an eighth transistor, and the display output circuit comprises a ninth transistor, a tenth transistor, and a first capacitor; a gate electrode of the seventh transistor is connected to the third clock signal terminal, a first electrode of the seventh transistor is connected to the first input signal terminal, and a second electrode of the seventh transistor is connected to the third node; a gate electrode of the eighth transistor is connected to the first clock signal terminal, a first electrode of the eighth transistor is connected to the third node, and a second electrode of the eighth transistor is connected to the first reference voltage signal terminal; a gate electrode of the ninth transistor is connected to the third node, a first electrode of the ninth transistor is connected to the fourth clock signal terminal, and a second electrode of the ninth transistor is connected to the second signal output terminal; a gate electrode of the tenth transistor is connected to the third node, a first electrode of the tenth transistor is connected to the fourth clock signal terminal, and a second electrode of the tenth transistor is connected to the first signal output terminal; and a first electrode of the first capacitor is connected to the third node, and a second electrode of the first capacitor is connected to the second signal output terminal or the first signal output terminal.

For example, in the shift register unit provided by an embodiment of the present disclosure, the detection circuit further comprises a detection input circuit and an output control circuit; the detection input circuit is connected to a second input signal terminal, a fifth clock signal terminal, and a fourth node, and is configured to input a second input signal provided by the second input signal terminal to the fourth node in response to a fifth clock signal provided by the fifth clock signal terminal; the detection output circuit further comprises a second control terminal, and the detection output circuit is further connected to a second reference voltage signal terminal, and is further configured to output a second reference voltage signal provided by the second reference voltage signal terminal to the output terminal of the detection output circuit under control of a level of the second control terminal of the detection output circuit; and the output control circuit is connected to the fourth node, a sixth clock signal terminal, the first reference voltage signal terminal, and the second control terminal of the detection output circuit, and is configured to control the level of the second control terminal under control of a level of the fourth node.

For example, in the shift register unit provided by an embodiment of the present disclosure, the detection input circuit comprises an eleventh transistor, the output control circuit comprises a twelfth transistor, a thirteenth transistor, a fourteenth transistor, a fifteenth transistor, and a second capacitor, and the detection output circuit further comprises a sixteenth transistor; a gate electrode of the eleventh transistor is connected to the fifth clock signal terminal, a first electrode of the eleventh transistor is connected to the second input signal terminal, and a second electrode of the eleventh transistor is connected to the fourth node; a gate electrode of the twelfth transistor is connected to the fourth node, a first electrode of the twelfth transistor is connected to the sixth clock signal terminal, and a second electrode of the twelfth transistor is connected to the gate electrode of the sixth transistor; a gate electrode of the thirteenth transistor is connected to a first electrode of the thirteenth transistor, and is connected to the sixth clock signal terminal, and a second electrode of the thirteenth transistor is connected to a fifth node; a gate electrode of the fourteenth transistor is connected to the fourth node, a first electrode of the fourteenth transistor is connected to the fifth node, and a second electrode of the fourteenth transistor is connected to the first reference voltage signal terminal; a gate electrode of the fifteenth transistor is connected to a first electrode of the fifteenth transistor, and is connected to the fifth clock signal terminal, and a second electrode of the fifteenth transistor is connected to the gate electrode of the sixth transistor; a gate electrode of the sixteenth transistor serves as the second control terminal of the detection output circuit, and is connected to the fifth node, a first electrode of the sixteenth transistor is connected to the second electrode of the sixth transistor, and a second electrode of the sixteenth transistor is connected to the second reference voltage signal terminal; and a first electrode of the second capacitor is connected to the fourth node, and a second electrode of the second capacitor is connected to the gate electrode of the sixth transistor.

For example, in the shift register unit provided by an embodiment of the present disclosure, the display circuit further comprises a third control circuit; the third control circuit is connected to a seventh clock signal terminal, an eighth clock signal terminal, the first node, and the third node, and is configured to control the level of the first node under control of a level of the third node; and the first control circuit is further connected to the third node and the first reference voltage signal terminal, and is further configured to perform noise reduction on the third node under control of the level of the first node.

For example, in the shift register unit provided by an embodiment of the present disclosure, the first control circuit further comprises a seventeenth transistor, and the third control circuit comprises an eighteenth transistor, a nineteenth transistor, and a twentieth transistor; a gate electrode of the seventeenth transistor is connected to the first node, a first electrode of the seventeenth transistor is connected to the third node, and a second electrode of the seventeenth transistor is connected to the first reference voltage signal terminal; a gate electrode of the eighteenth transistor is connected to a first electrode of the eighteenth transistor, and is connected to the seventh clock signal terminal, and a second electrode of the eighteenth transistor is connected to the first node; a gate electrode of the nineteenth transistor is connected to the third node, a first electrode of the nineteenth transistor is connected to the first node, and a second electrode of the nineteenth transistor is connected to the first reference voltage signal terminal; a gate electrode of the twentieth transistor is connected to a first electrode of the twentieth transistor, and is connected to the eighth clock signal terminal, and a second electrode of the twentieth transistor is connected to the first node; and a phase of a signal at the seventh clock signal terminal is opposite to a phase of a signal at the eighth clock signal terminal.

For example, in the shift register unit provided by an embodiment of the present disclosure, the display circuit further comprises a first reset circuit; and the first reset circuit is connected to the third node, a first reset signal terminal, and the first reference voltage signal terminal, and is configured to reset the third node in response to a first reset signal provided by the first reset signal terminal.

For example, in the shift register unit provided by an embodiment of the present disclosure, the first reset circuit comprises a twenty-first transistor; and a gate electrode of the twenty-first transistor is connected to the first reset signal terminal, a first electrode of the twenty-first transistor is connected to the third node, and a second electrode of the twenty-first transistor is connected to the first reference voltage signal terminal.

For example, in the shift register unit provided by an embodiment of the present disclosure, the detection circuit further comprises a fourth control circuit; the fourth control circuit is connected to a seventh clock signal terminal, an eighth clock signal terminal, the second node, and the fourth node, and is configured to control the level of the second node under control of the level of the fourth node; and the second control circuit is further connected to the fourth node and the first reference voltage signal terminal, and is further configured to perform noise reduction on the fourth node under control of the level of the second node.

For example, in the shift register unit provided by an embodiment of the present disclosure, the second control circuit further comprises a twenty-second transistor, and the fourth control circuit comprises a twenty-third transistor, a twenty-fourth transistor, and a twenty-fifth transistor; a gate electrode of the twenty-second transistor is connected to the second node, a first electrode of the twenty-second transistor is connected to the fourth node, and a second electrode of the twenty-second transistor is connected to the first reference voltage signal terminal; a gate electrode of the twenty-third transistor is connected to the fourth node, a first electrode of the twenty-third transistor is connected to the second node, and a second electrode of the twenty-third transistor is connected to the first reference voltage signal terminal; a gate electrode of the twenty-fourth transistor is connected to a first electrode of the twenty-fourth transistor, and is connected to the seventh clock signal terminal, and a second electrode of the twenty-fourth transistor is connected to the second node; a gate electrode of the twenty-fifth transistor is connected to a first electrode of the twenty-fifth transistor, and is connected to the eighth clock signal terminal, and a second electrode of the twenty-fifth transistor is connected to the second node; and a phase of a signal at the seventh clock signal terminal is opposite to a phase of a signal at the eighth clock signal terminal.

For example, in the shift register unit provided by an embodiment of the present disclosure, the detection circuit further comprises a second reset circuit; and the second reset circuit is connected to the fourth node, a second reset signal terminal, and the first reference voltage signal terminal, and is configured to reset the fourth node in response to a second reset signal provided by the second reset signal terminal.

For example, in the shift register unit provided by an embodiment of the present disclosure, the second reset circuit comprises a twenty-sixth transistor, and the output control circuit further comprises a twenty-seventh transistor; a gate electrode of the twenty-sixth transistor is connected to the second reset signal terminal, a first electrode of the twenty-sixth transistor is connected to the fourth node, and a second electrode of the twenty-sixth transistor is connected to the first reference voltage signal terminal; and a gate electrode of the twenty-seventh transistor is connected to a ninth clock signal terminal, a first electrode of the twenty-seventh transistor is connected to the fifth node, and a second electrode of the twenty-seventh transistor is connected to the first reference voltage signal terminal.

At least one embodiment of the present disclosure also provides a method for driving the shift register unit according to any one of the embodiments of the present disclosure, and the method comprises: in the display phase, the first control circuit performing noise reduction on the output terminal of the display circuit under control of the level of the first node, and the first bias control circuit being turned off under control of the first clock signal; and in the non-display phase, the first bias control circuit being turned on under control of the first clock signal and transmitting the first reference voltage signal to the first node, thereby turning off the first control circuit.

At least one embodiment of the present disclosure also provides a gate drive circuit, which comprises the shift register unit according to any one of the embodiments of the present disclosure.

At least one embodiment of the present disclosure also provides a display device, which comprises the gate drive circuit according to any one of the embodiments of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

FIG. 7 is a schematic flowchart of a method for driving a shift register unit according to an embodiment of the present disclosure;

FIG. 8 is a schematic block diagram of a gate drive circuit according to an embodiment of the present disclosure.

DETAILED DESCRIPTION

Figure 1A:
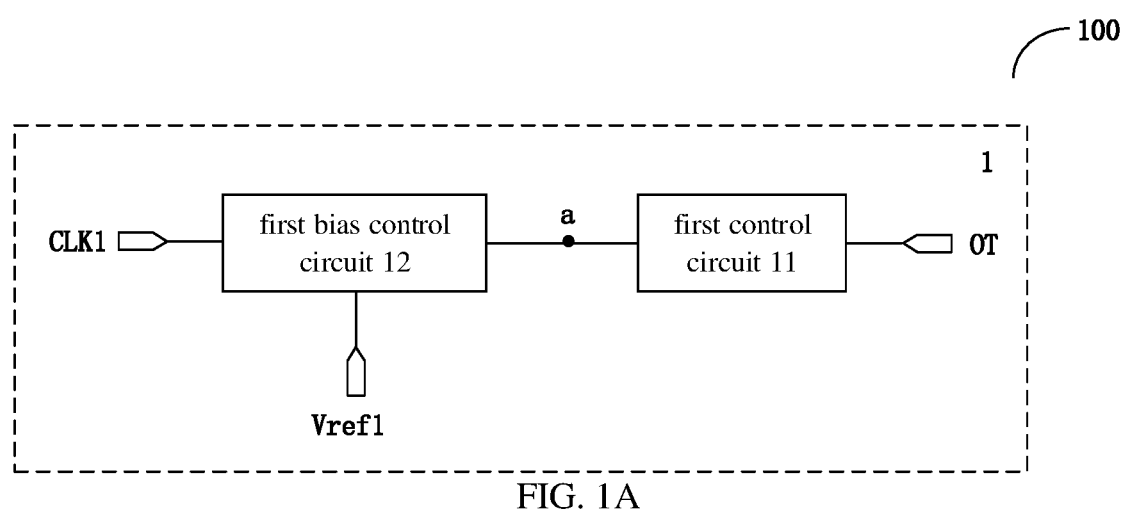
FIG. 1A is a schematic block diagram of a shift register unit according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the absolute position of the object which is described is changed, the relative position relationship may be changed accordingly.

A gate drive circuit usually comprises a plurality of shift register units which are cascaded, and each shift register unit comprises, for example, a display circuit and a detection circuit. A pulse of an output signal of the display circuit and a pulse of an output signal of the detection circuit are compounded and then provided to a corresponding gate line, so that a drive scanning signal and a detection scanning signal are provided to the gate line in different periods, respectively. The display circuit and the detection circuit usually comprise pull-down transistors, during the application process, the pull-down transistors of the display circuit and the detection circuit are subject to the forward bias for a long time, which makes the forward bias of the pull-down transistors serious, thereby causing a threshold voltage loss to the pull-down transistors, resulting in an abnormal output. Therefore, how to alleviate the threshold voltage loss caused by the forward bias to ensure the normal output of the shift register unit is a technical problem to be solved urgently by those skilled in the art.

At least one embodiment of the present disclosure provides a shift register unit, a method for driving a shift register unit, a gate drive circuit, and a display device. The shift register unit can reduce the threshold voltage loss caused by the forward bias of the pull-down transistor, thereby ensuring the normal output of the shift register unit and extending the service life.

The shift register unit provided by the embodiments of the present disclosure comprises a display circuit, the display circuit is configured to provide a drive scanning signal to a corresponding gate line in a display phase, and the display circuit comprises a first control circuit and a first bias control circuit. The first control circuit is connected to a first node, and is configured to perform noise reduction on an output terminal of the display circuit under control of a level of the first node. The first bias control circuit is connected to a first clock signal terminal, a first reference voltage signal terminal, and the first node, and is configured to transmit a first reference voltage signal provided by the first reference voltage signal terminal to the first node under control of a first clock signal provided by the first clock signal terminal, thereby turning off the first control circuit by controlling the level of the first node in a non-display phase. For example, the first control circuit comprises a pull-down transistor, and the pull-down transistor is in a forward bias state for a long time during the display phase. By providing a first level signal to the first clock signal terminal in the display phase, and providing a second level signal to the first clock signal terminal in the non-display phase, the pull-down transistor works normally in the display phase and is turned off (closed) in the non-display phase, and thus, the pull-down transistor, that is in the forward bias state for a long time, is in a reverse bias state in the non-display phase. The above method can alleviate the threshold voltage change caused by the long-term forward bias of the pull-down transistor during the display phase, thereby ensuring the normal output of the shift register unit and extending the service life.

The specific implementations of the shift register unit, the method for driving the shift register unit, the gate drive circuit, and the display device according to the embodiments of the present disclosure are described in detail below with reference to the accompanying drawings.

FIG. 1A is a schematic block diagram of a shift register unit according to an embodiment of the present disclosure. As illustrated in FIG. 1A, a shift register unit 100 comprises a display circuit 1, and the display circuit 1 is configured to provide a drive scanning signal to a corresponding gate line during a display phase. The display circuit 1 comprises a first control circuit 11 and a first bias control circuit 12.

The first control circuit 11 is connected to a first node a, and is configured to perform noise reduction (for example, pull-down noise reduction) on an output terminal OT of the display circuit 1 under control of a level of the first node a. The first bias control circuit 12 is connected to a first clock signal terminal CLK1, a first reference voltage signal terminal Vref1, and the first node a, and is configured to transmit a first reference voltage signal provided by the first reference voltage signal terminal Vref1 to the first node a under control of a first clock signal provided by the first clock signal terminal CLK1, thereby turning off the first control circuit 11 by controlling the level of the first node a (for example, pulling down the first node a to a low level) in a non-display phase.

For example, the first clock signal is a first level signal in the display phase, the first clock signal is a second level signal in the non-display phase, and the first level signal is different from the second level signal.

For example, in the display phase, the first clock signal terminal CLK1 provides the first level signal, that is, the first clock signal is the first level signal (for example, a low level signal). At this time, the first bias control circuit 12 is in an off state, and the first reference voltage signal (for example, a low level signal) cannot be transmitted to the first node a. Therefore, the first control circuit 11 can work normally. The first control circuit 11 may be, for example, a pull-down circuit in a general shift register unit, and is in a forward bias state for a long time in the display phase.

In the non-display phase, the first clock signal terminal CLK1 provides the second level signal, that is, the first clock signal is the second level signal (for example, a high level signal). At this time, the first bias control circuit 12 is in an on state, and the first reference voltage signal (for example, a low level signal) is transmitted to the first node a, thereby pulling down the level of the first node a, and thus the first control circuit 11 is turned off under the function of the low level of the first node a. At this time, the first control circuit 11 is in a reverse bias state.

In this way, the first clock signal changes in different phases, so that the bias state of a transistor (for example, a pull-down transistor) in the first control circuit 11 is changed, thereby alleviating problems such as the threshold voltage change of the transistor caused by the reason that the transistor is always in one bias state.

Figure 1B:
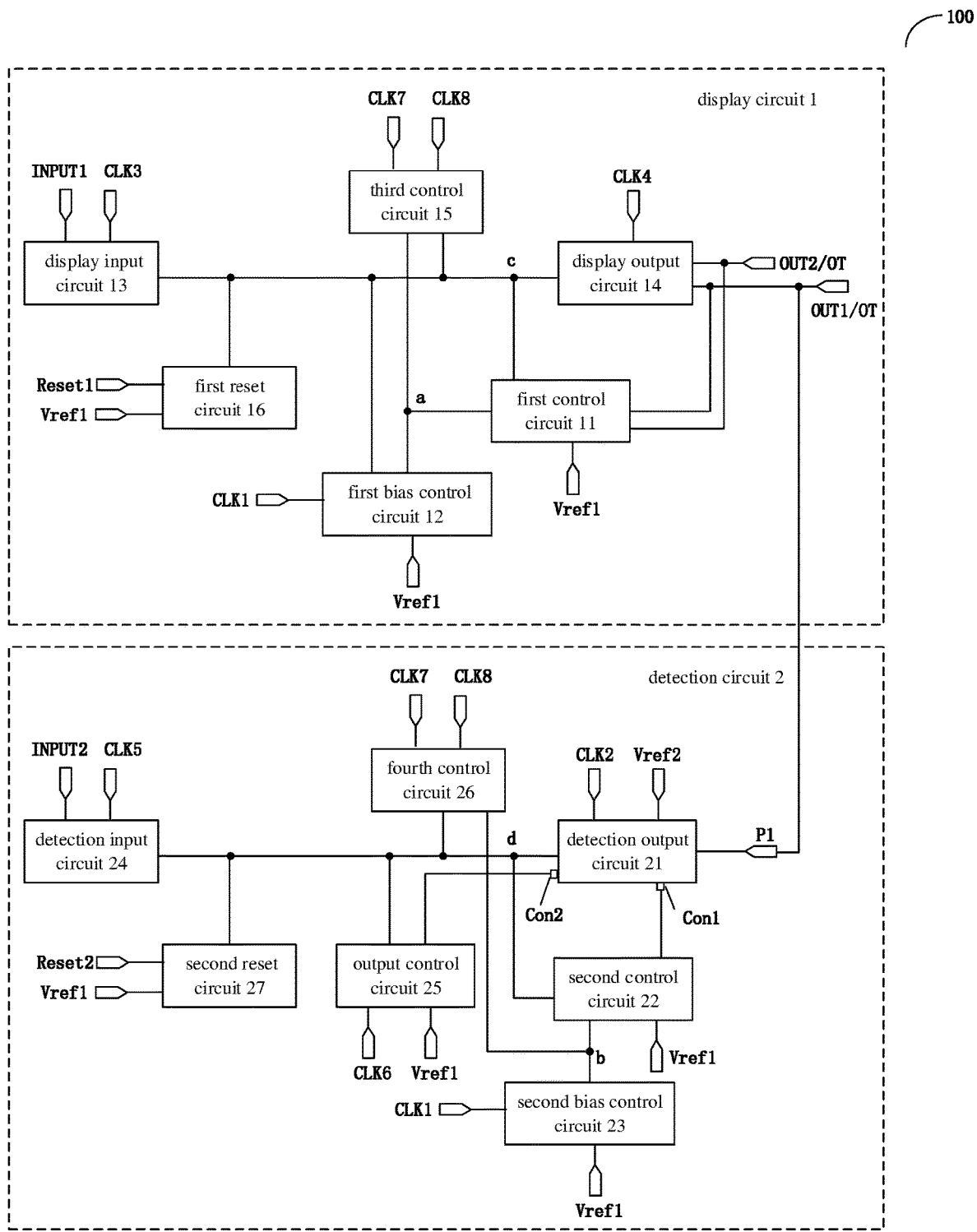
FIG. 1B is a schematic block diagram of another shift register unit according to an embodiment of the present disclosure.

FIG. 1B is a schematic block diagram of another shift register unit according to an embodiment of the present disclosure. As illustrated in FIG. 1B, a shift register unit 100 comprises a display circuit 1 and a detection circuit 2. The display circuit 1 is configured to provide a drive scanning signal to a corresponding gate line in a display phase, and the detection circuit 2 is configured to provide a detection scanning signal to the corresponding gate line in a non-display phase.

The display circuit 1 comprises a first control circuit 11, a first bias control circuit 12, a display input circuit 13, a display output circuit 14, a third control circuit 15, and a first reset circuit 16. For example, an output terminal OT of the display circuit 1 comprises a first signal output terminal OUT1 and a second signal output terminal OUT2.

The first control circuit 11 is connected to a first node a, a third node c, and a first reference voltage signal terminal Vref1, and is configured to perform noise reduction (e.g., pull-down noise reduction) on the first signal output terminal OUT1, the second signal output terminal OUT2, and the third node c under control of a level of the first node a.

The first bias control circuit 12 is connected to a first clock signal terminal CLK1, the first reference voltage signal terminal Vref1, the first node a, and the third node c, and is configured to transmit a first reference voltage signal provided by the first reference voltage signal terminal Vref1 to the first node a under control of a first clock signal provided by the first clock signal terminal CLK1, thereby turning off the first control circuit 11 by controlling the level of the first node a (e.g., pulling down the first node a to a low level) and transmitting the first reference voltage signal to the third node c in the non-display phase.

The display input circuit 13 is connected to a first input signal terminal INPUT1, a third clock signal terminal CLK3, and the third node c, and is configured to, in response to a third clock signal provided by the third clock signal terminal CLK3, input a first input signal provided by the first input signal terminal INPUT1 to the third node c, so as to, for example, charge the third node c to pull up the third node c to a high level.

The display output circuit 14 is connected to the third node c and a fourth clock signal terminal CLK4, and is configured to output a fourth clock signal provided by the fourth clock signal terminal CLK4 to the first signal output terminal OUT1 and the second signal output terminal OUT2 under control of a level of the third node c.

The third control circuit 15 is connected to a seventh clock signal terminal CLK7, an eighth clock signal terminal CLK8, the first node a, and the third node c, and is configured to control the level of the first node a under control of the level of the third node c.

The first reset circuit 16 is connected to the third node c, a first reset signal terminal Reset1, and the first reference voltage signal terminal Vref1, and is configured to reset the third node c in response to a first reset signal provided by the first reset signal terminal Reset1.

The detection circuit 2 comprises a detection output circuit 21, a second control circuit 22, a second bias control circuit 23, a detection input circuit 24, an output control circuit 25, a fourth control circuit 26, and a second reset circuit 27.

The detection output circuit 21 comprises a first control terminal Con1, a second control terminal Con2, and an output terminal P1. The detection output circuit 21 is connected to a second clock signal terminal CLK2 and a second reference voltage signal terminal Vref2, and is configured to output a second clock signal provided by the second clock signal terminal CLK2 to the output terminal P1 under control of a level of the first control terminal Con1, and output a second reference voltage signal provided by the second reference voltage signal terminal Vref2 to the output terminal P1 under control of a level of the second control terminal Con2. The output terminal P1 of the detection output circuit 21 is connected to the first signal output terminal OUT1.

The second control circuit 22 is connected to a second node b, a fourth node d, the first reference voltage signal terminal Vref1, and the first control terminal Con1, and is configured to control the level of the first control terminal Con1 and perform noise reduction on the fourth node d under control of a level of the second node b.

The second bias control circuit 23 is connected to the first clock signal terminal CLK1, the first reference voltage signal terminal Vref1, and the second node b, and is configured to transmit the first reference voltage signal to the second node b under control of the first clock signal, thereby turning off the second control circuit 22 by controlling the level of the second node b (for example, by pulling down the second node b to a low level) in the non-display phase.

The detection input circuit 24 is connected to a second input signal terminal INPUT2, a fifth clock signal terminal CLK5, and the fourth node d, and is configured to input a second input signal provided by the second input signal terminal INPUT2 to the fourth node d in response to a fifth clock signal provided by the fifth clock signal terminal CLK5, so as to, for example, charge the fourth node d to pull up the fourth node d to a high level.

The output control circuit 25 is connected to the fourth node d, a sixth clock signal terminal CLK6, the first reference voltage signal terminal Vref1, and the second control terminal Con2 of the detection output circuit 21, and is configured to control the level of the second control terminal Con2 of the detection output circuit 21 under control of a level of the fourth node d.

The fourth control circuit 26 is connected to the seventh clock signal terminal CLK7, the eighth clock signal terminal CLK8, the second node b, and the fourth node d, and is configured to control the level of the second node b under control of the level of the fourth node d.

The second reset circuit 27 is connected to the fourth node d, a second reset signal terminal Reset2, and the first reference voltage signal terminal Vref1, and is configured to reset the fourth node d in response to a second reset signal provided by the second reset signal terminal Reset2.

In this embodiment, in the display phase, the first clock signal terminal CLK1 provides a first level signal (for example, a low level signal), and the first bias control circuit 12 and the second bias control circuit 23 are both in an off state, and therefore, the first control circuit 11 and the second control circuit 22 both work normally and are in a forward bias state for a long time. In the non-display phase, the first clock signal terminal CLK1 provides a second level signal (for example, a high level signal), and the first bias control circuit 12 and the second bias control circuit 23 are both in an on state, so that the first control circuit 11 is turned off under the function of the low level of the first node a, and the second control circuit 22 is turned off under the function of the low level of the second node b, and thus the first control circuit 11 and the second control circuits 22 are in a reverse bias state.

In this way, the first clock signal changes in different phases, so that the bias states of transistors (for example, pull-down transistors) in the first control circuit 11 and the second control circuit 22 are changed, thereby alleviating problems such as the threshold voltage change of the transistor caused by the reason that the transistor is always in one bias state.

Figure 1C:
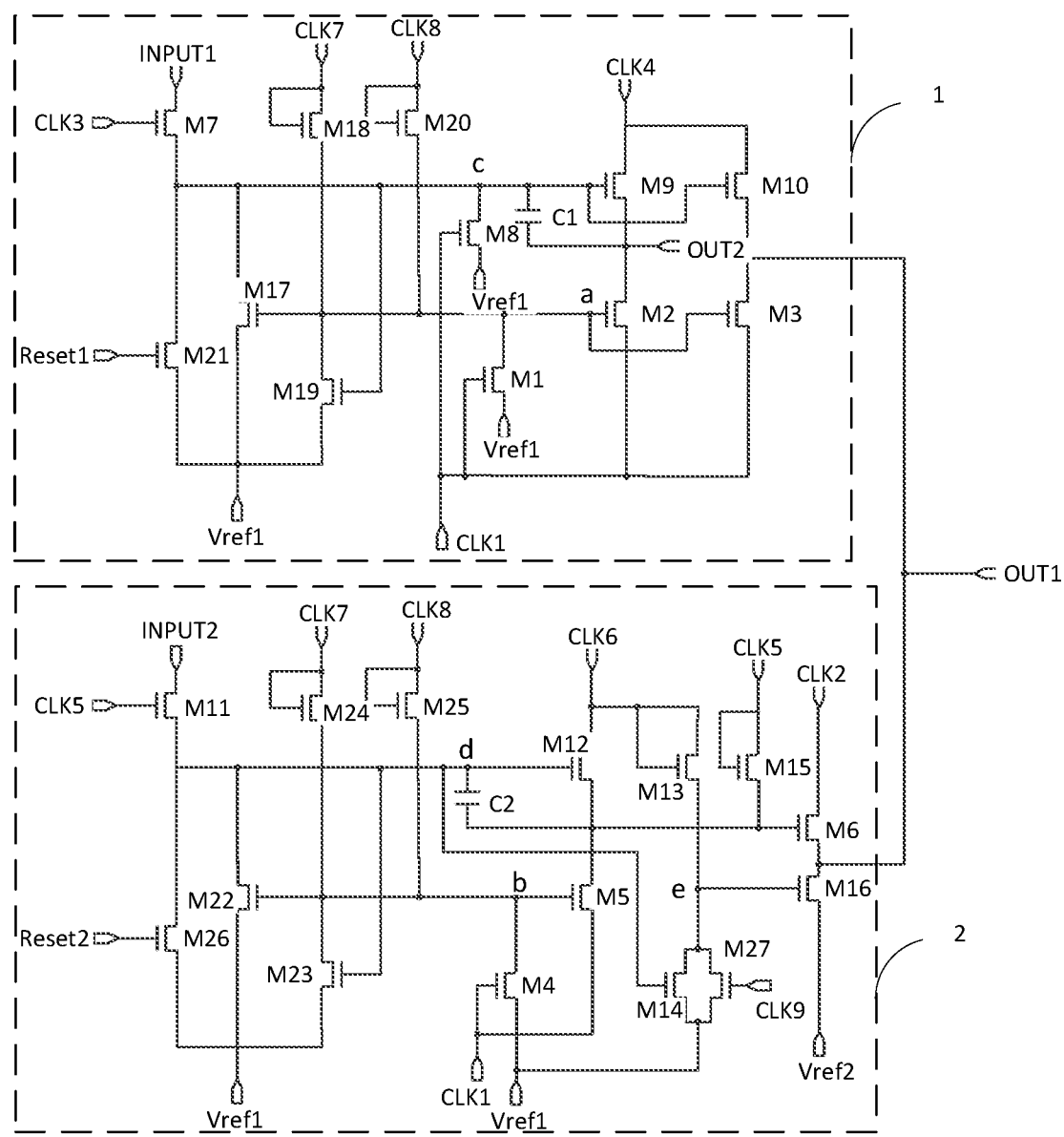
FIG. 1C is a schematic circuit diagram of the shift register unit illustrated in FIG. 1B.

FIG. 1C is a schematic circuit diagram of the shift register unit illustrated in FIG. 1B. As illustrated in FIG. 1C, the shift register unit 100 may be implemented as first to twenty-seventh transistors M1-M27, a first capacitor C1, and a second capacitor C2.

For example, the first bias control circuit 12 may be implemented as a first transistor M1 and an eighth transistor M8, and the first control circuit 11 may be implemented as a second transistor M2, a third transistor M3, and a seventeenth transistor M17. The first transistor M1 is configured to provide a signal of the first reference voltage signal terminal Vref1 to the first node a under control of the first clock signal terminal CLK1, thereby, for example, pulling down the first node a to a low level. The second transistor M2 is configured to provide a signal of the first clock signal terminal CLK1 to the second signal output terminal OUT2 under control of a potential of the first node a. The third transistor M3 is configured to provide the signal of the first clock signal terminal CLK1 to the first signal output terminal OUT1 under control of the potential of the first node a. The eighth transistor M8 is configured to provide the signal of the first reference voltage signal terminal Vref1 to the third node c under control of the first clock signal terminal CLK1, thereby, for example, pulling down the third node c to a low level. The seventeenth transistor M17 is configured to provide the signal of the first reference voltage signal terminal Vref1 to the third node c under control of the first node a.

A gate electrode of the first transistor M1 is connected to the first clock signal terminal CLK1, a first electrode of the first transistor M1 is connected to the first node a, and a second electrode of the first transistor M1 is connected to the first reference voltage signal terminal Vref1. A gate electrode of the second transistor M2 is connected to the first node a, a first electrode of the second transistor M2 is connected to the second signal output terminal OUT2, and a second electrode of the second transistor M2 is connected to the first clock signal terminal CLK1. A gate electrode of the third transistor M3 is connected to the first node a, a first electrode of the third transistor M3 is connected to the first signal output terminal OUT1, and a second electrode of the third transistor M3 is connected to the first clock signal terminal CLK1.

For example, the second bias control circuit 23 may be implemented as a fourth transistor M4, the second control circuit 22 may be implemented as a fifth transistor M5 and a twenty-second transistor M22, and the detection output circuit 21 may be implemented as a sixth transistor M6 and a sixteenth transistor M16. The fourth transistor M4 is configured to provide the signal of the first reference voltage signal terminal Vref1 to the second node b under control of the first clock signal terminal CLK1, so as to, for example, pull down the level of the second node b to a low level. The fifth transistor M5 is configured to provide the signal of the first clock signal terminal CLK1 to a gate electrode of the sixth transistor M6 under control of a potential of the second node b. The sixth transistor M6 is configured to provide a signal of the second clock signal terminal CLK2 to the first signal output terminal OUT1 under control of a potential of the first electrode of the fifth transistor M5. The sixteenth transistor M16 is configured to provide a signal of the second reference voltage signal terminal Vref2 to the first signal output terminal OUT1 under control of a fifth node e. The twenty-second transistor M22 is configured to provide the signal of the first reference voltage signal terminal Vref1 to the fourth node d under control of the potential of the second node b.

A gate electrode of the fourth transistor M4 is connected to the first clock signal terminal CLK1, a first electrode of the fourth transistor M4 is connected to the second node b, and a second electrode of the fourth transistor M4 is connected to the first reference voltage signal terminal Vref1. A gate electrode of the fifth transistor M5 is connected to the second node b, the first electrode of the fifth transistor M5 is connected to the gate electrode of the sixth transistor M6, and a second electrode of the fifth transistor M5 is connected to the first clock signal terminal CLK1. The gate electrode of the sixth transistor M6 serves as the first control terminal Con1 of the detection output circuit 21, a first electrode of the sixth transistor M6 is connected to the second clock signal terminal CLK2, and a second electrode of the sixth transistor M6 serves as the output terminal P1 of the detection output circuit 21 and is connected to the first signal output terminal OUT1. A gate electrode of the sixteenth transistor M16 serves as the second control terminal Con2 of the detection output circuit 21, and is connected to the fifth node e, a first electrode of the sixteenth transistor M16 is connected to the second electrode of the sixth transistor M6, and a second electrode of the sixteenth transistor M16 is connected to the second reference voltage signal terminal Vref2. A gate electrode of the twenty-second transistor M22 is connected to the second node b, a first electrode of the twenty-second transistor M22 is connected to the fourth node d, and a second electrode of the twenty-second transistor M22 is connected to the first reference voltage signal terminal Vref1.

The display input circuit 13 may be implemented as a seventh transistor M7, and the display output circuit 14 may be implemented as a ninth transistor M9, a tenth transistor M10, and a first capacitor C1. The seventh transistor M7 is configured to provide a signal of the first input signal terminal INPUT1 to the third node c under control of the third clock signal terminal CLK3. The ninth transistor M9 is configured to provide a signal of the fourth clock signal terminal CLK4 to the second signal output terminal OUT2 under control of the third node c. The tenth transistor M10 is configured to provide the signal of the fourth clock signal terminal CLK4 to the first signal output terminal OUT1 under control of the third node c. The first capacitor C1 is configured to keep a voltage difference between the third node c and the second signal output terminal OUT2 stable.

A gate electrode of the seventh transistor M7 is connected to the third clock signal terminal CLK3, a first electrode of the seventh transistor M7 is connected to the first input signal terminal INPUT1, and a second electrode of the seventh transistor M7 is connected to the third node c. A gate electrode of the ninth transistor M9 is connected to the third node c, a first electrode of the ninth transistor M9 is connected to the fourth clock signal terminal CLK4, and a second electrode of the ninth transistor M9 is connected to the second signal output terminal OUT2. A gate electrode of the tenth transistor M10 is connected to the third node c, a first electrode of the tenth transistor M10 is connected to the fourth clock signal terminal CLK4, and a second electrode of the tenth transistor M10 is connected to the first signal output terminal OUT1. A first electrode of the first capacitor C1 is connected to the third node c, and a second electrode of the first capacitor C1 is connected to the second signal output terminal OUT2 or the first signal output terminal OUT1.

The detection input circuit 24 may be implemented as an eleventh transistor M11, and the output control circuit 25 may be implemented as a twelfth transistor M12, a thirteenth transistor M13, a fourteenth transistor M14, a fifteenth transistor M15, a twenty-seventh transistor M27, and a second capacitor C2. The eleventh transistor M11 is configured to provide a signal of the second input signal terminal INPUT2 to the fourth node d under control of the fifth clock signal terminal CLK5. The twelfth transistor M12 is configured to provide a signal of the sixth clock signal terminal CLK6 to the gate electrode of the sixth transistor M6 under control of a potential of the fourth node d. The thirteenth transistor M13 is configured to provide the signal of the sixth clock signal terminal CLK6 to the fifth node e under control of the sixth clock signal terminal CLK6. The fourteenth transistor M14 is configured to provide the signal of the first reference voltage signal terminal Vref1 to the fifth node e under control of the fourth node d. The fifteenth transistor M15 is configured to provide a signal of the fifth clock signal terminal CLK5 to the gate electrode of the sixth transistor M6 under control of the fifth clock signal terminal CLK5. The twenty-seventh transistor M27 is configured to provide the signal of the first reference voltage signal terminal Vref1 to the fifth node e under control of the ninth clock signal terminal CLK9. The second capacitor C2 is configured to keep a voltage difference between the fourth node d and the gate electrode of the sixth transistor M6 stable.

A gate electrode of the eleventh transistor M11 is connected to the fifth clock signal terminal CLK5, a first electrode of the eleventh transistor M11 is connected to the second input signal terminal INPUT2, and a second electrode of the eleventh transistor M11 is connected to the fourth node d. A gate electrode of the twelfth transistor M12 is connected to the fourth node d, a first electrode of the twelfth transistor M12 is connected to the sixth clock signal terminal CLK6, and a second electrode of the twelfth transistor M12 is connected to the gate electrode of the sixth transistor M6. A gate electrode of the thirteenth transistor M13 is connected to a first electrode of the thirteenth transistor M13, and is connected to the sixth clock signal terminal CLK6, and a second electrode of the thirteenth transistor M13 is connected to the fifth node e. A gate electrode of the fourteenth transistor M14 is connected to the fourth node d, a first electrode of the fourteenth transistor M14 is connected to the fifth node e, and a second electrode of the fourteenth transistor M14 is connected to the first reference voltage signal terminal Vref1. A gate electrode of the fifteenth transistor M15 is connected to a first electrode of the fifteenth transistor M15, and is connected to the fifth clock signal terminal CLK5, a second electrode of the fifteenth transistor M15 is connected to the gate electrode of the sixth transistor M6. A first electrode of the second capacitor C2 is connected to the fourth node d, and a second electrode of the second capacitor C2 is connected to the gate electrode of the sixth transistor M6. A gate electrode of the twenty-seventh transistor M27 is connected to the ninth clock signal terminal CLK9, a first electrode of the twenty-seventh transistor M27 is connected to the fifth node e, and a second electrode of the twenty-seventh transistor M27 is connected to the first reference voltage signal terminal Vref1. The twenty-seventh transistor M27 is configured to reset the fifth node e to prevent the residual voltage on the fifth node e from affecting the signal output of a next frame.

The third control circuit 15 may be implemented as an eighteenth transistor M18, a nineteenth transistor M19, and a twentieth transistor M20. The eighteenth transistor M18 is configured to provide a signal of the seventh clock signal terminal CLK7 to the first node a under control of the seventh clock signal terminal CLK7. The nineteenth transistor M19 is configured to provide the signal of the first reference voltage signal terminal Vref1 to the first node a under control of the third node c. The twentieth transistor M20 is configured to provide a signal of the eighth clock signal terminal CLK8 to the first node a under control of the eighth clock signal terminal CLK8.

A gate electrode of the eighteenth transistor M18 is connected to a first electrode of the eighteenth transistor M18, and is connected to the seventh clock signal terminal CLK7, and a second electrode of the eighteenth transistor M18 is connected to the first node a. A gate electrode of the nineteenth transistor M19 is connected to the third node c, a first electrode of the nineteenth transistor M19 is connected to the first node a, and a second electrode of the nineteenth transistor M19 is connected to the first reference voltage signal terminal Vref1. A gate electrode of the twentieth transistor M20 is connected to a first electrode of the twentieth transistor M20, and is connected to the eighth clock signal terminal CLK8, and a second electrode of the twentieth transistor M20 is connected to the first node a. For example, a phase of the signal at the seventh clock signal terminal CLK7 is opposite to a phase of the signal at the eighth clock signal terminal CLK8.

The first reset circuit 16 may be implemented as a twenty-first transistor M21. The twenty-first transistor M21 is configured to provide the signal of the first reference voltage signal terminal Vref1 to the third node c under control of the first reset signal terminal Reset1.

A gate electrode of the twenty-first transistor M21 is connected to the first reset signal terminal Reset1, a first electrode of the twenty-first transistor M21 is connected to the third node c, and a second electrode of the twenty-first transistor M21 is connected to the first reference voltage signal terminal Vref1. The twenty-first transistor M21 is configured to reset the third node c to prevent the residual voltage on the third node c from affecting the signal output of the next frame.

The fourth control circuit 26 may be implemented as a twenty-third transistor M23, a twenty-fourth transistor M24, and a twenty-fifth transistor M25. The twenty-third transistor M23 is configured to provide the signal of the first reference voltage signal terminal Vref1 to the second node b under control of the potential of the fourth node d. The twenty-fourth transistor M24 is configured to provide the signal of the seventh clock signal terminal CLK7 to the second node b under control of the seventh clock signal terminal CLK7. The twenty-fifth transistor M25 is configured to provide the signal of the eighth clock signal terminal CLK8 to the second node b under control of the eighth clock signal terminal CLK8.

A gate electrode of the twenty-third transistor M23 is connected to the fourth node d, a first electrode of the twenty-third transistor M23 is connected to the second node b, and a second electrode of the twenty-third transistor M23 is connected to the first reference voltage signal terminal Vref1. A gate electrode of the twenty-fourth transistor M24 is connected to a first electrode of the twenty-fourth transistor M24, and is connected to the seventh clock signal terminal CLK7, and a second electrode of the twenty-fourth transistor M24 is connected to the second node b. A gate electrode of the twenty-fifth transistor M25 is connected to a first electrode of the twenty-fifth transistor M25, and is connected to the eighth clock signal terminal CLK8, and a second electrode of the twenty-fifth transistor M25 is connected to the second node b. For example, the phase of the signal at the seventh clock signal terminal CLK7 is opposite to the phase of the signal at the eighth clock signal terminal CLK8.

The second reset circuit 27 may be implemented as a twenty-sixth transistor M26. The twenty-sixth transistor M26 is configured to provide the signal of the first reference voltage signal terminal Vref1 to the fourth node d under control of the second reset signal terminal Reset2.

A gate electrode of the twenty-sixth transistor M26 is connected to the second reset signal terminal Reset2, a first electrode of the twenty-sixth transistor M26 is connected to the fourth node d, and a second electrode of the twenty-sixth transistor M26 is connected to the first reference voltage signal terminal Vref1. The twenty-sixth transistor M26 is configured to reset the fourth node d to prevent the residual voltage on the fourth node d from affecting the signal output of the next frame.

It should be noted that, the first level signal and the second level signal mentioned in the above embodiments of the present disclosure refer to a high level (high potential) or a low level (low potential), rather than specific voltage values, and the specific voltage values of the first level signal and the second level signal are not limited herein, as long as the transistors can be turned on or turned off. For example, in a case where the second transistor, the third transistor, and the fifth transistor are all N-type transistors, the first level signal is a low level signal, and the second level signal is a high level signal; and in a case where the second transistor, the third transistor, and the fifth transistor are all P-type transistors, the first level signal is a high level signal, and the second level signal is a low level signal. That is, the first level signal is a signal that can turn off the second transistor, the third transistor, and the fifth transistor, and the second level signal is a signal that can turn on the second transistor, the third transistor, and the fifth transistor.

In the above-mentioned shift register unit provided by the embodiments of the present disclosure, taking that all transistors are N-type transistors as an example, in the display phase, the first clock signal terminal provides a low level signal, the first transistor is turned off, and the second electrode of the second transistor and the second electrode of the third transistor are always kept at a low level, so that the second transistor and the third transistor are always in the forward bias state. Similarly, the fifth transistor of the detection circuit is always in the forward bias state in the display phase. However, in the non-display phase, the first clock signal terminal provides a high level signal, the first transistor is turned on to provide the signal of the first reference voltage signal terminal to the first node, and the second transistor and the third transistor are turned off. At this time, the second electrode of the second transistor and the second electrode of the third transistor are both kept at a high level, so that the second transistor and the third transistor are in the reverse bias state. Similarly, in the non-display phase, the second electrode of the fifth transistor of the detection circuit is kept at a high level and is in the reverse bias state. By changing the signal of the first clock signal terminal in different phases in the above embodiments, the bias states of the second transistor, the third transistor, and the fifth transistor are changed, thereby alleviating problems such as the threshold voltage loss of the transistors caused by the reason that the transistors are always in one bias state.

The above-mentioned shift register unit provided by the embodiments of the present disclosure comprises a display circuit and a detection circuit, and the display circuit is configured to provide a drive scanning signal to a corresponding gate line in a display phase; and the detection circuit is configured to provide a detection scanning signal to the corresponding gate line in a non-display phase. By providing a first level signal to the first clock signal terminal in the display phase and providing a second level signal to the first clock signal terminal in the non-display phase, the second transistor, the third transistor, and the fifth transistor, which are in the forward bias state for a long time, are in the reverse bias state in the non-display phase. In this way, the threshold voltage change, caused by the reason that the second transistor, the third transistor, and the fifth transistor are in the forward bias state for a long time in the display phase, of the second transistor, the third transistor, and the fifth transistor can be alleviated, thereby ensuring the normal output of the shift register unit.

It should be noted that, in the above-mentioned shift register unit provided by the embodiments of the present disclosure, the first signal output terminal is configured to cascade with a display circuit of a previous-stage shift register unit and a display circuit of a next-stage shift register unit; and the second signal output terminal is configured to provide the drive scanning signal to the corresponding gate line in the display panel, so as to drive corresponding pixels to display.

It should be noted that, in the above-mentioned shift register unit provided by the embodiments of the present disclosure, the first signal output terminal is not only used to cascade with a detection circuit of the previous-stage shift register unit and a detection circuit of the next-stage shift register unit, but also used to provide the detection scanning signal to the corresponding gate line of the display panel, thereby performing detection on the pixel circuit in the display panel.

It should be noted that, in the above-mentioned shift register unit provided by the embodiments of the present disclosure, the function of the eighteenth transistor and the function of the twentieth transistor are the same. By the control of the seventh clock signal terminal and the eighth clock signal terminal, the eighteenth transistor and the twentieth transistor alternately work to provide the signal of the seventh clock signal terminal or the signal of the eighth clock signal terminal to the first node. That is, in a case where the seventh clock signal terminal is at a high level, the eighth clock signal terminal is at a low level, and in this case, the eighteenth transistor is turned on to provide the signal of the seventh clock signal terminal to the first node, and the twentieth transistor is turned off; and in a case where the seventh clock signal terminal is at a low level, the eighth clock signal terminal is at a high level, and in this case, the twentieth transistor is turned on to provide the signal of the eighth clock signal terminal to the first node, and the eighteenth transistor is turned off. The eighteenth transistor and the twentieth transistor can alternately operate to extend the service life of the eighteenth transistor and the service life of the twentieth transistor.

It should be noted that, in the above-mentioned shift register unit provided by the embodiments of the present disclosure, the function of the twenty-fourth transistor and the function of the twenty-fifth transistor are the same. By the control of the seventh clock signal terminal and the eighth clock signal terminal, the twenty-fourth transistor and the twenty-fifth transistor alternately operate to provide the signal of the seventh clock signal terminal or the signal of the eighth clock signal terminal to the second node. That is, in a case where the seventh clock signal terminal is at a high level, the eighth clock signal terminal is at a low level, and in this case, the twenty-fourth transistor is turned on to provide the signal of the seventh clock signal terminal to the second node, and the twenty-fifth transistor is turned off; and in a case where the seventh clock signal terminal is at a low level, the eighth clock signal terminal is at a high level, and in this case, the twenty-fifth transistor is turned on to provide the signal of the eighth clock signal terminal to the second node, and the twenty-fourth transistor is turned off. The twenty-fourth transistor and the twenty-fifth transistor can alternately operate to extend the service life of the twenty-fourth transistor and the service life of the twenty-fifth transistor.

In the above-mentioned shift register unit provided by the embodiments of the present disclosure, in order to simplify the manufacturing process, the transistors are generally made of the same material, and therefore, all the transistors are N-type transistors or P-type transistors. In the specific implementations, in a case where a potential of a required gate-on signal is high, all the transistors are N-type transistors; and in a case where a potential of a required gate-on signal is low, all the transistors are P-type transistors.

Further, in the specific implementations, the N-type transistor is turned on under the function of a high potential and is turned off under the function of a low potential; and the P-type transistor is turned off under the function of a high potential and is turned on under the function of a low potential.

It should be noted that the transistors mentioned in the above embodiments of the present disclosure may be thin film transistors (TFTs), metal oxide semiconductor field effect transistors (MOS s), or other switching devices having the same characteristics, and the embodiments of the present disclosure are not limited thereto.

It should be noted that a source electrode and a drain electrode of a transistor used in the embodiments of the present disclosure may be symmetrical in structure, and therefore, the source electrode and the drain electrode of the transistor may be indistinguishable in physical structure. In the embodiments of the present disclosure, in order to distinguish two electrodes of the transistor except a gate electrode of the transistor, one of the two electrodes is directly described as a first electrode, and the other of the two electrodes is described as a second electrode. In the specific implementations, the first electrode of the transistor is the source electrode and the second electrode of the transistor is the drain electrode, or the first electrode of the transistor is the drain electrode and the second electrode of the transistor is the source electrode, and no specific distinction is given here.

In addition, the transistors in the embodiments of the present disclosure are described by taking N-type transistors as an example. In this case, the first electrode of the transistor is the drain electrode, and the second electrode is the source electrode. It should be noted that the present disclosure comprises but is not limited thereto. For example, one or more transistors in the shift register unit provided by the embodiments of the present disclosure may also be P-type transistors, and in this case, the first electrode of the transistor is the source electrode and the second electrode of the transistor is the drain electrode, so long as the respective electrodes of the transistor of selected type are connected correspondingly with reference to the connection manner of the respective electrodes of the corresponding transistor in the embodiments of the present disclosure, and the corresponding voltage terminal is provided with a corresponding high voltage or low voltage. In a case where an N-type transistor is used, indium gallium zinc oxide (IGZO) can be adopted as an active layer of the thin film transistor, compared to that low temperature polysilicon (LTPS) or amorphous silicon (for example, hydrogenation amorphous silicon) is adopted as the active layer of the thin film transistor, the size of the transistor can be effectively reduced and the leakage current can be prevented.

In the embodiments of the present disclosure, for example, in a case where each circuit is implemented as N-type transistors, the term "pull-up" means charging a node or an electrode of a transistor so as to raise the absolute value of the level of the node or the electrode, thereby implementing an operation (e.g., conduction) of the corresponding transistor; and the term "pull-down" means discharging a node or an electrode of a transistor so as to decrease the absolute value of the level of the node or the electrode, thereby implementing an operation (e.g., turn-off) of the corresponding transistor. For another example, in a case where each circuit is implemented as P-type transistors, the term "pull-up" means discharging a node or an electrode of a transistor so as to decrease the absolute value of the level of the node or the electrode, thereby implementing the operation (e.g., conduction) of the corresponding transistor; and the term "pull-down" means charging a node or an electrode of a transistor so as to raise the absolute value of the level of the node or the electrode, thereby implementing the operation (e.g., turn-off) of the corresponding transistor.

It should be noted that, in the embodiments of the present disclosure, the first capacitor C1 and the second capacitor C2 can be capacitor devices manufactured by a manufacturing process, for example, by manufacturing special capacitor electrodes to implement the capacitor device, respective electrodes of the capacitor can be achieved by a metal layer, a semiconductor layer (for example, doped polysilicon), or the like. Moreover, the first capacitor C1 and the second capacitor C2 may also be parasitic capacitors between devices, and can be implemented by the transistors themselves and other devices as well as wirings. The connection mode of the first capacitor C1 and the second capacitor C2 is not limited to the connection mode described above, and may be other suitable connection modes, as long as the first capacitor C1 and the second capacitor C2 can store the corresponding levels.

It should be noted that, in the description of each embodiment of the present disclosure, the first node a, the second node b, the third node c, the fourth node d, and the fifth node e do not represent actual components that actually exist, but rather represent conjunction nodes of related electrical connections in a circuit diagram.

It should be noted that, in the embodiments of the present disclosure, the first reference voltage signal terminal Vref1 and the second reference voltage signal terminal Vref2 may be the same or different, that is, the first reference voltage signal and the second reference voltage signal may be the same or different, which may be determined according to actual requirements, and the embodiments of the present disclosure are not limited thereto.

A working process of the above-mentioned shift register unit provided by the embodiments of the present disclosure is described below with reference to a circuit timing diagram. In the following description, 1 indicates a high-potential signal, and 0 indicates a low-potential signal.

Figure 2:
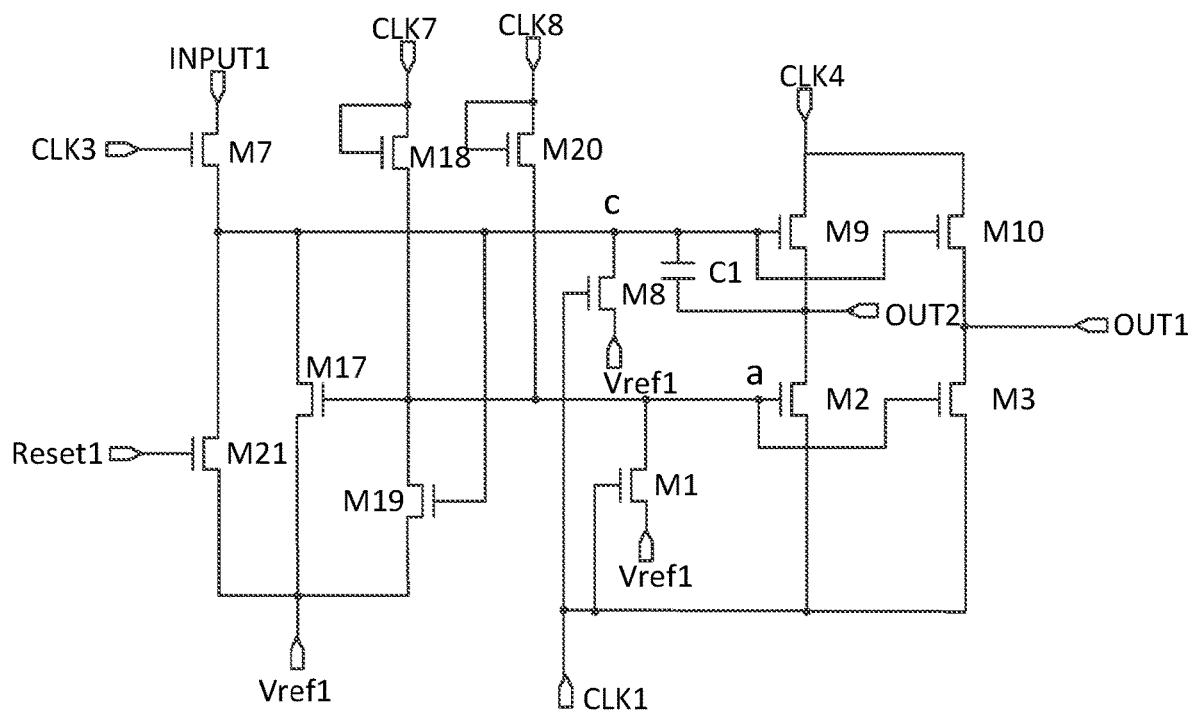
FIG. 2 is a schematic diagram of a display circuit of a shift register unit according to an embodiment of the present disclosure.
Figure 3:
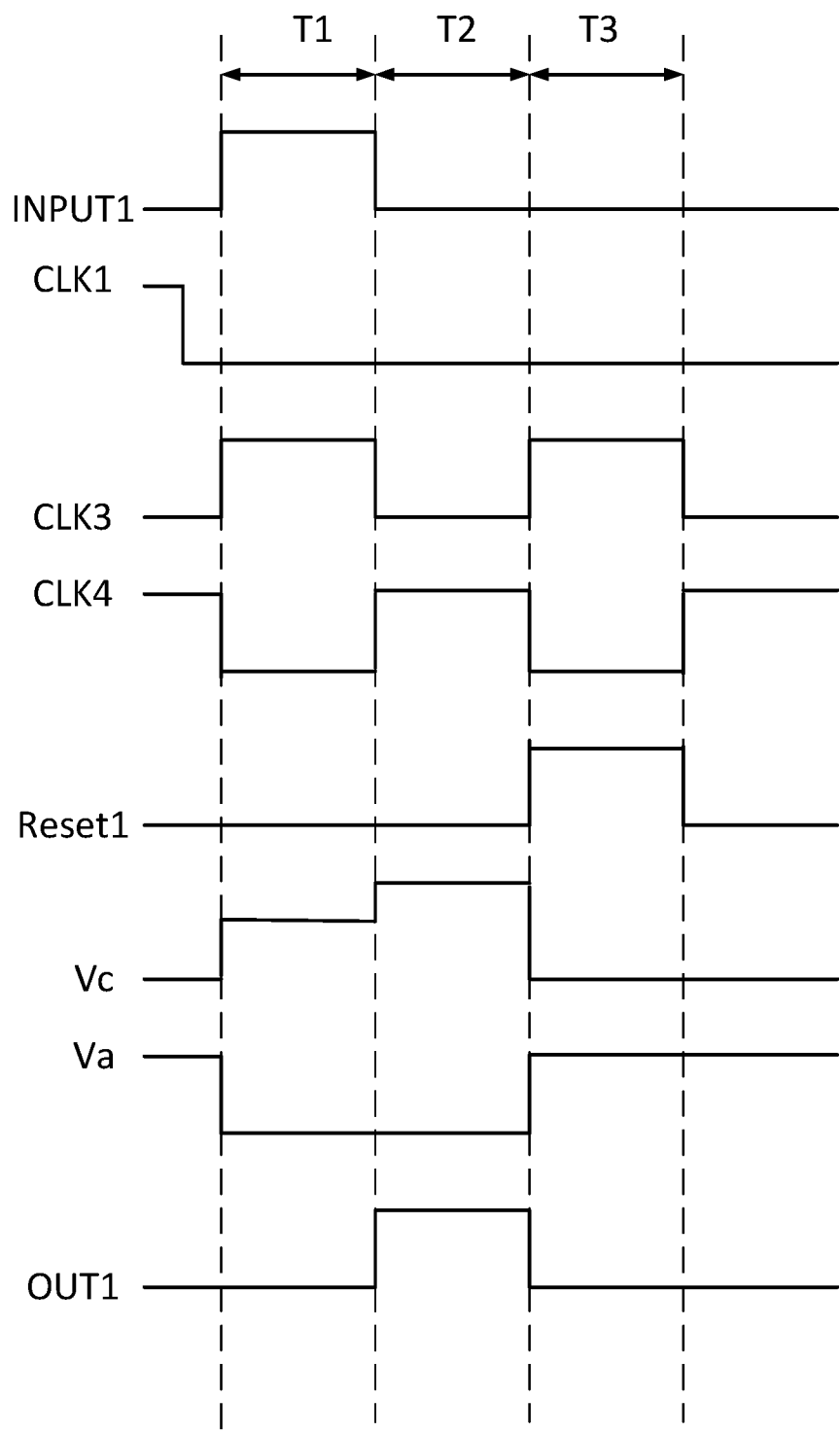
FIG. 3 is an input-output timing diagram corresponding to the display circuit illustrated in FIG. 2.

Taking the display circuit of the shift register unit illustrated in FIG. 2 as an example, all the transistors of the display circuit illustrated in FIG. 2 are N-type transistors, the display circuit illustrated in FIG. 2 is basically the same as the display circuit of the shift register unit illustrated in FIG. 1C, the first reference voltage signal terminal Vref1 is at a low potential, and a corresponding input-output timing diagram is illustrated in FIG. 3. In the display phase, the working process of the display circuit is divided into three sub-phases: T1, T2, and T3.

In the sub-phase T1, INPUT1=1, CLK1=0, CLK3=1, CLK4=0, Reset1=0, CLK7=0, and CLK8=1.

The third clock signal terminal CLK3 is at a high potential, so that the seventh transistor M7 is turned on, the first reset signal terminal Reset1 is at a low level, the twenty-first transistor M21 is turned off, and the turned-on seventh transistor M7 provides a high level signal of the first input signal terminal INPUT1 to the third node c, so that a voltage Vc of the third node is a high level, and thus, the nineteenth transistor M19 is turned on, the signal of the first reference voltage signal terminal Vref1 is provided to the first node a, so that a voltage Va of the first node is a low level, thereby turning off the second transistor M2, the third transistor M3, and the seventeenth transistor M17. Because the first clock signal terminal CLK1 is at a low level, the first transistor M1 and the eighth transistor M8 are turned off. Because the voltage Vc of the third node is at a high level, so as to charge the first capacitor C1 and turn on the ninth transistor M9 and the tenth transistor M10, the turned-on ninth transistor M9 provides a low level signal of the fourth clock signal terminal CLK4 to the second signal output terminal OUT2, and the turned-on tenth transistor M10 provides the low level signal of the fourth clock signal terminal CLK4 to the first signal output terminal OUT1. In this phase, the first clock signal terminal CLK1 is always kept at a low level, and thus, the first transistor M1 and the eighth transistor M8 are always in an off state.

In the sub-phase T2, INPUT1=0, CLK1=0, CLK3=0, CLK4=1, Reset1=0, CLK7=0, and CLK8=1.

In this phase, due to the existence of the first capacitor C1, the voltage Vc of the third node c still remains at a high potential, and the ninth transistor M9 and the tenth transistor M10 are turned on, the turned-on ninth transistor M9 provides a high level signal of the fourth clock signal terminal CLK4 to the second signal output terminal OUT2, and the turned-on tenth transistor M10 provides the high level signal of the fourth clock signal terminal CLK4 to the first signal output terminal OUT1.

In the sub-phase T3, INPUT1=0, CLK1=0, CLK3=1, CLK4=0, Reset1=1, CLK7=0, and CLK8=1.

Because the first reset signal terminal Reset1 is at a high potential, the twenty-first transistor M21 is turned on, thereby providing the signal of the first reference voltage signal terminal Vref1 to the third node c to pull down the potential of the third node c, that is, the potential of the third node c is reset. Because the voltage Vc of the third node c is at a low level, the nineteenth transistor M19 is turned off, and the twentieth transistor M20 provides a high level signal of the eighth clock signal terminal CLK8 to the first node a, so that the second transistor M2 and the third transistor M3 are turned on to perform noise reduction on the first signal output terminal OUT1 and the second signal output terminal OUT2, and thus, the first signal output terminal OUT1 and the second signal output terminal OUT2 output low level signals.

Figure 4:
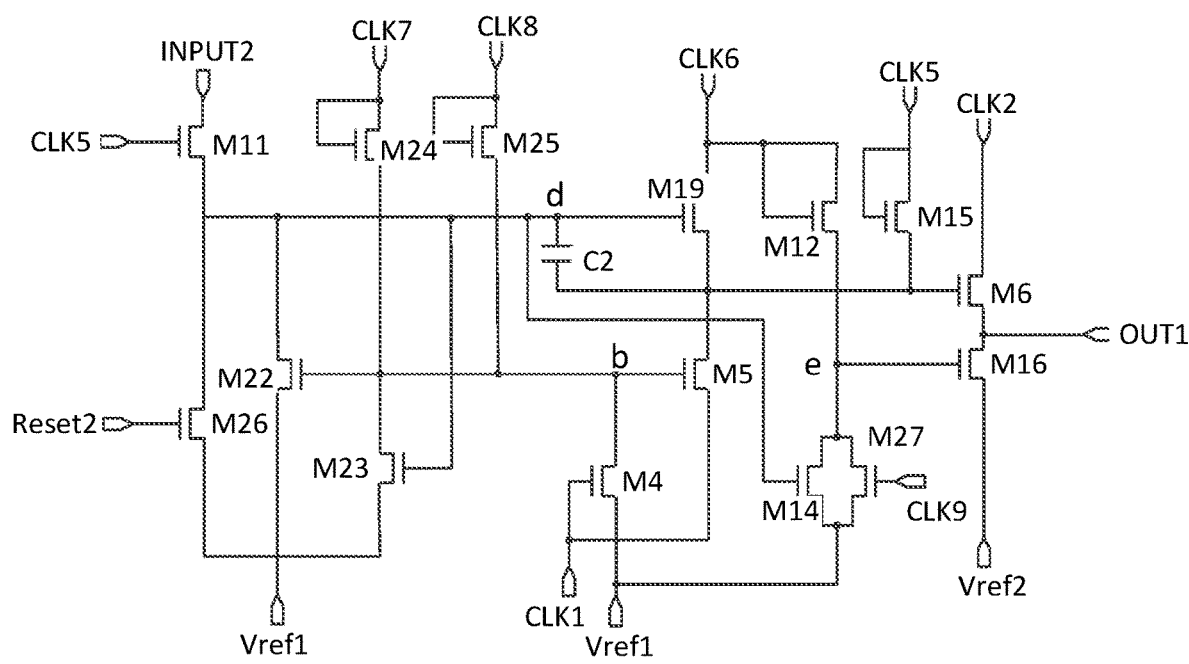
FIG. 4 is a schematic diagram of a detection circuit of a shift register unit according to an embodiment of the present disclosure.
Figure 5:
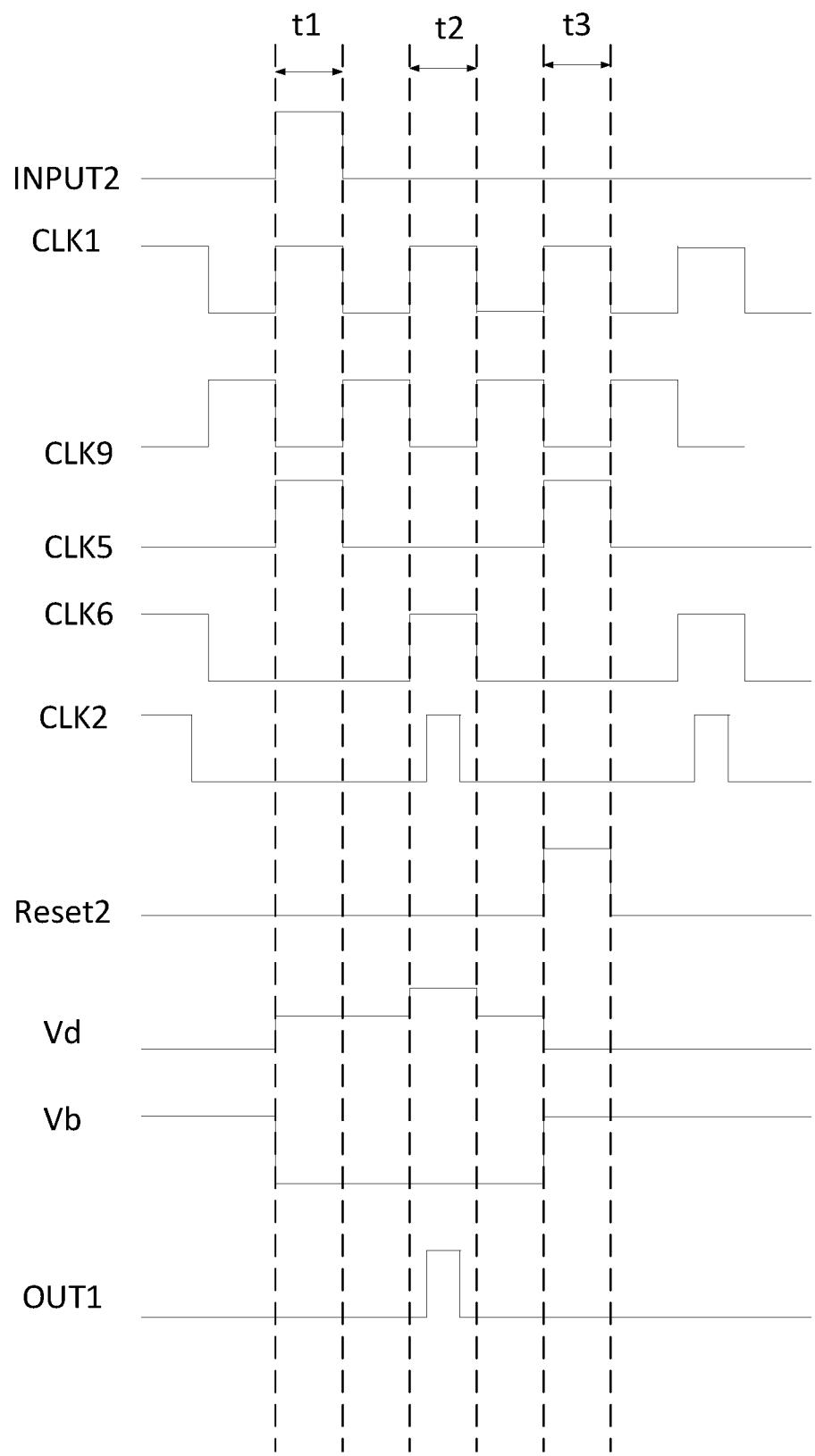
FIG. 5 is an input-output timing diagram corresponding to the detection circuit illustrated in FIG. 4.

Taking the detection circuit of the shift register unit illustrated in FIG. 4 as an example, all the transistors of the detection circuit illustrated in FIG. 4 are N-type transistors, the detection circuit illustrated in FIG. 4 is basically the same as the detection circuit of the shift register unit illustrated in FIG. 1C. The first reference voltage signal terminal Vref1 is at a low potential, and a corresponding input-output timing diagram is illustrated in FIG. 5. In the following description, the first reference voltage signal terminal Vref1 is the same as the second reference voltage signal terminal Vref2 (that is, the first reference voltage signal is the same as the second reference voltage signal), and the first reference voltage signal terminal Vref1 and the first reference voltage signal described below can be equivalently understood as the second reference voltage signal terminal Vref2 and the second reference voltage signal, respectively. In the non-display phase, the working process of the detection circuit is divided into three sub-phases: t1, t2 and t3.

In the sub-phase t1, INPUT2=1, CLK1=1, CLK9=0, CLK5=1, CLK6=0, CLK2=0, CLK7=0, CLK8=1, and Reset2=0.

At the beginning, the eighth clock signal terminal CLK8 is at a high level, so that the twenty-fifth transistor M25 is turned on, so as to provide the high level of the eighth clock signal terminal CLK8 to the second node b. That is, a voltage Vb of the second node b is at a high level, so that the twenty-second transistor M22 is turned on, and the signal of the first reference voltage signal terminal Vref1 is provided to the fourth node d, so as to set a voltage Vd of the fourth node d to a low potential. In this case, the fifth clock signal terminal CLK5 is at a high level, and the eleventh transistor M11 is turned on, thereby providing a high level signal of the second input signal terminal INPUT2 to the fourth node d to set the voltage Vd of the fourth node d to be a high potential, and charging the second capacitor C2. The sixth clock signal terminal CLK6 is at a low potential, and the fifth clock signal terminal CLK5 is at a high potential. However, a channel width-to-length ratio of the fifteenth transistor M15 is greater than a channel width-to-length ratio of the twelfth transistor M12, so that the gate electrode of the sixth transistor M6 is at a high potential, and the sixth transistor M6 is turned on to provide a low level signal of the second clock signal terminal CLK2 to the first signal output terminal OUT1. In this case, the voltage Vd of the fourth node d is a high potential, and the fourteenth transistor M14 is turned on to provide the signal of the first reference voltage signal terminal Vref1 to the gate electrode of the sixteenth transistor M16, so that the sixteenth transistor M16 is turned off and does not affect the output of the first signal output terminal OUT1.

In the sub-phase t2, INPUT2=0, CLK1=1, CLK9=0, CLK5=0, CLK6=1, CLK2=1, CLK7=0, CLK8=1, and Reset2=0.

Due to the existence of the second capacitor C2, the voltage Vd of the fourth node d still remains at a high potential. Because the sixth clock signal terminal CLK6 provides a high level signal, the twelfth transistor M12 is turned on to provide the high level signal of the sixth clock signal terminal CLK6 to the gate electrode of the sixth transistor M6, so that the sixth transistor M6 is turned on, and the high level signal of the second clock signal terminal CLK2 is provided to the first signal output terminal OUT1. At this time, the fifth clock signal terminal CLK5 is at a low potential, and the eleventh transistor M11 and the fifteenth transistor M15 are turned off. The voltage Vd of the fourth node d is a high level signal, so that the fourteenth transistor M14 is turned on, and the turned-on fourteenth transistor M14 provides the signal of the first reference voltage signal terminal Vref1 to the gate electrode of the sixteenth transistor M16, and thus, the sixteenth transistor M16 is turned off and does not affect the output of the first signal output terminal OUT1.

In the sub-phase t3, INPUT2=0, CLK1=1, CLK9=0, CLK5=1, CLK6=0, CLK2=0, CLK7=0, CLK8=1, and Reset2=1.

In this sub-phase, the second reset signal terminal Reset2 and the fifth clock signal terminal CLK5 both provide high level signals, so that the eleventh transistor M11 and the twenty-sixth transistor M26 are turned on. The turned-on eleventh transistor M11 provides a low level signal of the second input signal terminal INPUT2 to the fourth node d, the twenty-sixth transistor M26 is turned on to provide the signal of the first reference voltage signal terminal Vref1 to the fourth node d, thereby resetting the fourth node d. At this time, because the fifth clock signal terminal CLK5 is at a high level, the fifteenth transistor M15 is turned on to provide the high level signal of the fifth clock signal terminal CLK5 to the gate electrode of the sixth transistor M6, so that the sixth transistor M6 is turned on to provide the low level signal of the second clock signal terminal CLK2 to the first signal output terminal OUT1, thereby pulling down the potential of the first signal output terminal OUT1.

It can be known from the above descriptions that, in the shift register unit provided by the above embodiments of the present disclosure, the display circuit mainly works in the display phase, and the detection circuit mainly works in the non-display phase. Therefore, when the display circuit works, the signals of the signal terminals connected to the transistors in the detection circuit enable the transistors in the detection circuit to be turned off, so as to avoid affecting the output of the display circuit; and when the detection circuit works, the signals of the signal terminals connected to the transistors in the display circuit enable the transistors of the display circuit to be turned off, so as to avoid affecting the output of the detection circuit.

For example, the first transistor and the eighth transistor in the display circuit and the fourth transistor in the detection circuit are all controlled by the first clock signal terminal. In the display phase, the first clock signal terminal maintains a low level signal, the first transistor, the eighth transistor, and the fourth transistor are in an off state, and the second transistor, the third transistor, and the fifth transistor are in a forward bias state. In the non-display phase, the first clock signal terminal maintains a high level signal, the first transistor, the eighth transistor, and the fourth transistor are in an on state, and the second transistor, the third transistor, and the fifth transistor are in a reverse bias state. In this way, not only the normal display and detection of the display panel can be achieved, but also the bias states of the second transistor, the third transistor, and the fifth transistor can be continuously changed by changing the first clock signal in different phases, thereby preventing the threshold voltages of the transistors from changing due to the second transistor, the third transistor, and the fifth transistor being in one bias state for a long time, and ensuring the normal output of the shift register unit.

Figure 6:
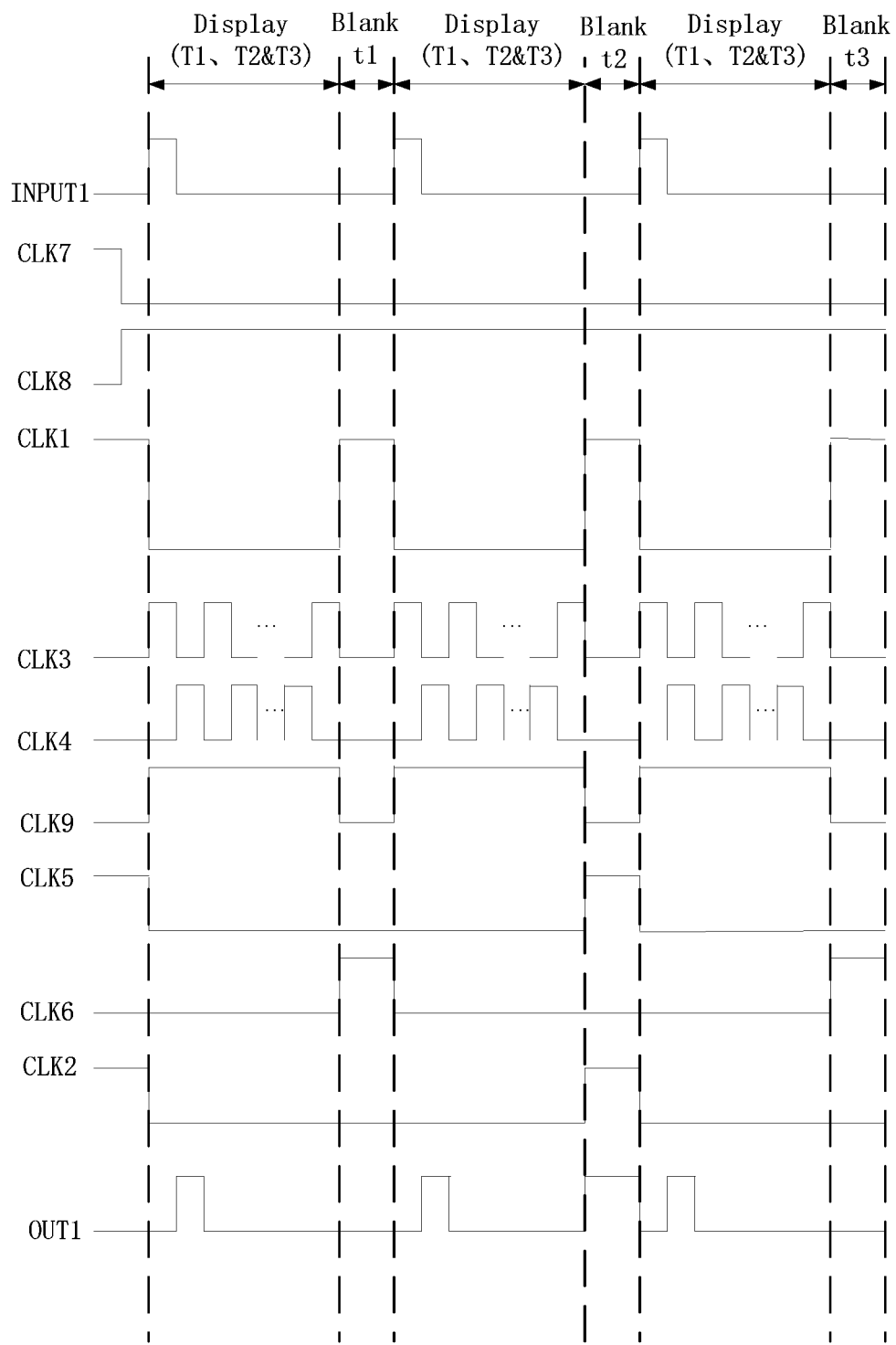
FIG. 6 is an input-output timing diagram corresponding to a shift register unit according to an embodiment of the present disclosure.

It should be noted that, in the above-mentioned shift register unit provided by the embodiments of the present disclosure, as illustrated in FIG. 6, each frame comprises a display phase Display and a non-display phase Blank, and the three sub-phases (t1, t2, and t3) of the working process of the detection circuit are not completed in a non-display phase Blank within one frame time, instead, the detection circuit completes only one sub-phase in the non-display phase Blank within one frame time. That is, the sub-phase t1 is completed in a non-display phase Blank of a first frame, the sub-phase t2 is completed in a non-display phase Blank of a second frame, and the sub-phase t3 is completed in a non-display phase Blank of a third frame, and one detection is completed in three frames. For example, for the signals output by the signal terminals in the display phase Display and the non-display phase Blank, reference can be made to the description of FIG. 3 and FIG. 5 above, and details are not described herein again.

It should be noted that, in the embodiments of the present disclosure, the first input signal terminal INPUT1 and the second input signal terminal INPUT2 can be connected to a same signal line to receive a same signal, or can also be connected to different signal lines to receive different signals, and the embodiments of the present disclosure are not limited thereto. In a case where the first input signal terminal INPUT1 and the second input signal terminal INPUT2 receive the same signal, in the non-display phase Blank, the third clock signal terminal CLK3 needs to be kept at a low level to keep the seventh transistor M7 off, thereby preventing the display circuit 1 from outputting an error signal in the non-display phase Blank; after entering the display phase Display, the third clock signal terminal CLK3 is kept at a high level and a low level alternately, so as to achieve a normal display function. In a case where the first input signal terminal INPUT1 and the second input signal terminal INPUT2 receive different signals, the third clock signal terminal CLK3 can be always kept at a high level and a low level alternately in the non-display phase Blank and the display phase Display, and by setting the signal of the first input signal terminal INPUT1 and the signal of the second input signal terminal INPUT2, the detection function and the display function are achieved.

At least one embodiment of the present disclosure also provides a method for driving a shift register unit. The method can be used to drive the shift register unit provided by any one of the embodiments of the present disclosure, and the threshold voltage loss caused by the forward bias of the pull-down transistor can be reduced, thereby ensuring the normal output of the shift register unit and extending the service life.

For example, in some examples, as illustrated in FIG. 7, the method comprises following operations.

Step S10: in the display phase, the first control circuit performing noise reduction on the output terminal of the display circuit under control of the level of the first node, and the first bias control circuit being turned off under control of the first clock signal;

Step S20: in the non-display phase, the first bias control circuit being turned on under control of the first clock signal and transmitting the first reference voltage signal to the first node, thereby turning off the first control circuit.

For example, in a case where the shift register unit adopts the circuit structure illustrated in FIG. 1C, the method may comprise following operations.

Step S110: in the display phase, the first transistor is turned off under control of the first clock signal terminal, and the fourth transistor is turned off under control of the first clock signal terminal;

Step S210: in the non-display phase, the fourth transistor provides the signal of the first clock signal terminal to the second node under control of the first clock signal terminal, the fifth transistor is turned off under control of the potential of the second node, the first transistor provides the signal of the first reference voltage signal terminal to the first node under control of the first clock signal terminal, the second transistor is turned off under control of the potential of the first node, and the third transistor is turned off under control of the potential of the first node.

For example, in the display phase, the first clock signal terminal provides a first level signal, and in the non-display phase, the first clock signal terminal provides a second level signal. The first level signal is different from the second level signal.

The specific driving process of the method for driving the shift register unit in the above embodiments has been described in detail in the forgoing content describing the working principle of the shift register unit, and therefore, for the specific driving process of the method for driving the shift register unit in the above embodiments, reference may be made to the foregoing content, and details are not repeated herein.

At least one embodiment of the present disclosure further provides a gate drive circuit, and the gate drive circuit comprises a plurality of shift register units that are cascaded provided by any one of the embodiments of the present disclosure. The shift register unit in the gate drive circuit can reduce the threshold voltage loss caused by the forward bias of the pull-down transistor, thereby ensuring the normal output of the shift register unit and extending the service life.

For example, in the gate drive circuit provided by the above embodiments of the present disclosure, in the respective shift register units, a display circuit is cascaded with another display circuit, and a detection circuit is cascaded with another detection circuit. For example, the respective display circuits are cascaded through second signal output terminals, and the respective detection circuits are cascaded through first signal output terminals.

For example, in some examples, a cascading manner of the shift register units is illustrated in FIG. 8. It should be noted that, FIG. 8 only illustrates three shift register units, i.e., SR1, SR2, and SR3, but this does not constitute a limitation to the embodiments of the present disclosure. A first input signal terminal INPUT1 of each shift register unit is connected to a second signal output terminal OUT2 of a previous shift register unit, a second input signal terminal INPUT2 of each shift register unit is connected to a first signal output terminal OUT1 of the previous shift register unit, a first reset signal terminal Reset1 of each shift register unit is connected to a second signal output terminal OUT2 of a next shift register unit, and a second reset signal terminal Reset2 of each shift register unit is connected to a first signal output terminal OUT1 of the next shift register unit. A first input signal terminal INPUT1 and a second input signal terminal INPUT2 of a first shift register unit may be connected to a trigger signal line provided separately, and a first reset signal terminal Reset1 and a second reset signal terminal Reset2 of the last shift register unit may be connected to a reset signal line provided separately. It should be noted that, for simplicity of description, FIG. 8 only illustrates the first signal output terminal OUT1, the second signal output terminal OUT2, the first input signal terminal INPUT1, the second input signal terminal INPUT2, the first reset signal terminal Reset1, and the second reset signal terminal Reset2 of each shift register unit, and does not illustrate each clock signal terminal and voltage signal terminal, and each clock signal terminal and voltage signal terminal may be respectively connected to a clock signal line and a voltage signal line provided separately.

It should be noted that the cascading manner illustrated in FIG. 8 is only schematic and not restrictive. The specific cascading manner of the respective shift register units in the gate drive circuit may be determined according to actual needs, and the embodiments of the present disclosure does not limit the cascading manner of the respective shift register units in the gate drive circuit.

At least one embodiment of the present disclosure also provides a display device, the display device comprises the above-mentioned gate drive circuit, and the gate drive circuit is configured to provide drive scanning signals for respective gate lines on an array substrate in the display device. The shift register unit of the gate drive circuit in the display device can reduce the threshold voltage loss caused by the forward bias of the pull-down transistor, thereby ensuring the normal output of the shift register unit and extending the service life.

Figure 9:
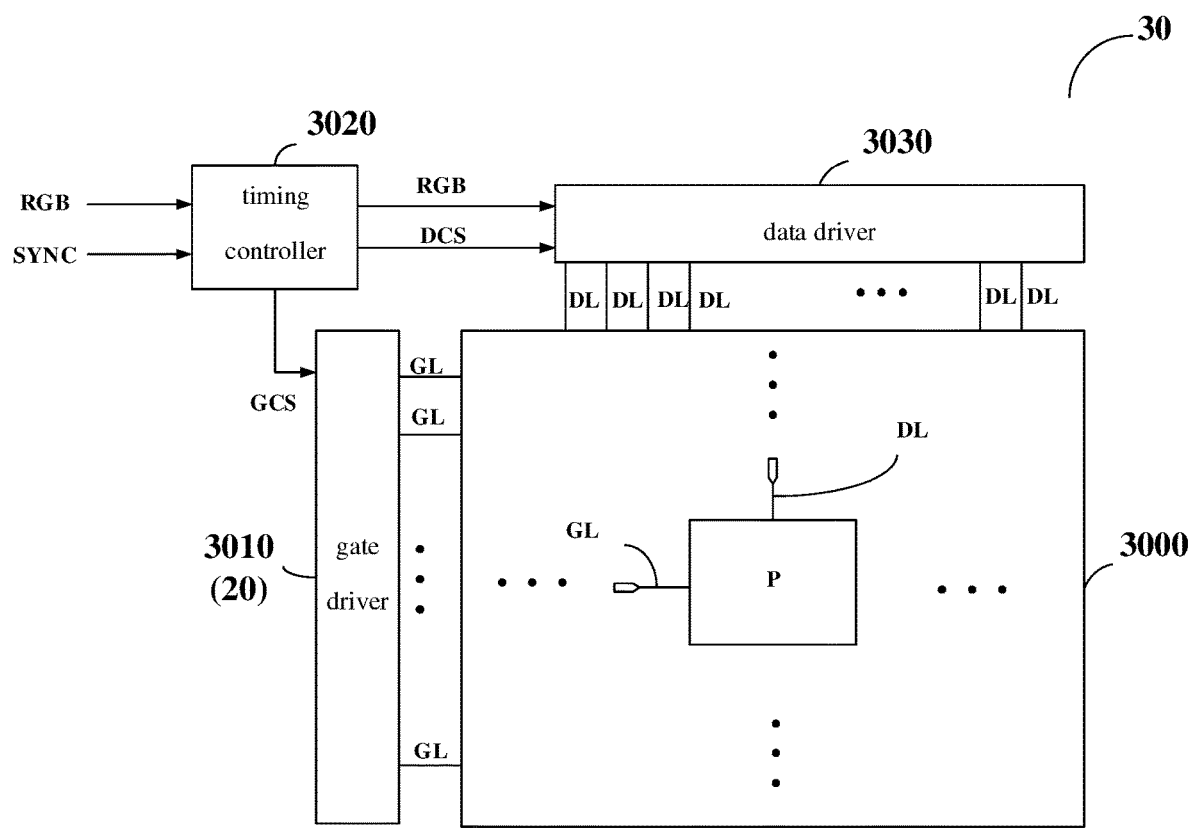
FIG. 9 is a schematic block diagram of a display device according to an embodiment of the present disclosure.

FIG. 9 is a schematic block diagram of a display device according to an embodiment of the present disclosure. Referring to FIG. 9, a display device 30 comprises a gate drive circuit 20, and the gate drive circuit 20 is the gate drive circuit according to any one of the embodiments of the present disclosure. For example, the display device 30 may be any product or component having a display function, such as a mobile phone, a tablet computer, a television, a display, a notebook computer, a digital photo frame, a navigator, and the like, and the embodiments of the present disclosure are not limited thereto. For the implementation of the display device 30, reference may be made to the above descriptions of the gate drive circuit and the shift register unit, and similar descriptions are not repeated herein.

For example, in an example, the display device 30 further comprises a display panel 3000, a gate driver 3010, a timing controller 3020, and a data driver 3030. The display panel 3000 comprises a plurality of pixel units P defined by a plurality of scanning lines GL and a plurality of data lines DL which cross the plurality of scanning lines GL. The gate driver 3010 is configured to drive the plurality of scanning lines GL; the data driver 3030 is configured to drive the plurality of data lines DL; and the timing controller 3020 is configured to process image data RGB input from the outside of the display device 30, provide the processed image data RGB to the data driver 3030, and output scanning control signals GCS and data control signals DCS to the gate driver 3010 and the data driver 3030, so as to control the gate driver 3010 and the data driver 3030.

For example, the gate driver 3010 comprises the gate drive circuit 20 provided by any one of the above embodiments. The first signal output terminals OUT1 of the plurality of shift register units in the gate drive circuit 20 are correspondingly connected to the plurality of scanning lines GL. The plurality of scanning lines GL are correspondingly connected to the pixel units P arranged in a plurality of rows. In the display phase, the first signal output terminals OUT1 of the shift register units in the gate drive circuit 20 sequentially output the drive scanning signals to the plurality of scanning lines GL, so as to perform progressive scanning on the plurality of rows of pixel units P in the display panel 3000. In the non-display phase, the first signal output terminals OUT1 of the shift register units in the gate drive circuit 20 output the detection scanning signals to the scanning lines GL, so as to perform compensation detection on the pixel units P in the display panel 3000. For example, the gate driver 3010 may be implemented as a semiconductor chip or may be integrated in the display panel 3000 to constitute a GOA circuit.

For example, the data driver 3030 converts digital image data RGB input from the timing controller 3020 into data signals according to the plurality of data control signals DCS originating from the timing controller 3020 by using a reference gamma voltage. The data driver 3030 provides the converted data signals to the plurality of data lines DL. For example, the data driver 3030 may be implemented as a semiconductor chip.

For example, the timing controller 3020 processes the image data RGB input from the outside to match the size and resolution of the display panel 3000, and then provides the processed image data to the data driver 3030. The timing controller 3020 generates the plurality of scanning control signals GCS and the plurality of data control signals DCS using synchronization signals (e.g., a dot clock DCLK, a data enable signal DE, a horizontal synchronization signal Hsync, and a vertical synchronization signal Vsync) input from the outside of the display device 30. The timing controller 3020 provides the scanning control signals GCS and the data control signals DCS, which are generated, to the gate driver 3010 and the data driver 3030, respectively, so as to control the gate driver 3010 and the data driver 3030.

The display device 30 may also comprise other components, such as a signal decoding circuit, a voltage conversion circuit, etc. These components may, for example, adopt existing conventional components, and are not described in detail herein.

In the above-mentioned shift register unit, the method for driving the shift register unit, the gate drive circuit, and the display device provided by the embodiments of the present disclosure, the shift register unit comprises a display circuit and a detection circuit, and the display circuit is configured to provide a drive scanning signal to a corresponding gate line in a display phase; and the detection circuit is configured to provide a detection scanning signal to the corresponding gate line in a non-display phase. By providing a first level signal to the first clock signal terminal in the display phase and providing a second level signal to the first clock signal terminal in the non-display phase, the second transistor, the third transistor, and the fifth transistor, that are in the forward bias state for a long time, are in the reverse bias state in the non-display phase. In this way, the threshold voltage change, caused by the reason that the second transistor, the third transistor, and the fifth transistor are in the forward bias state for a long time during the display phase, can be alleviated, thereby ensuring the normal output of the shift register unit.

Obviously, various changes and modifications can be made to the present disclosure by those skilled in the art, without departing from the spirits and the scope of the present disclosure. Therefore, so far as these changes and modifications fall within the scope of the claims and their equivalents of the present disclosure, the present disclosure shall also intend to cover such changes and modifications.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising a display circuit, wherein the display circuit is configured to provide a drive scanning signal to a corresponding gate line in a display phase, and the display circuit comprises a first control circuit and a first bias control circuit;
    the first control circuit is connected to a first node, and is configured to allow a signal of an output terminal of the display circuit to be at a non-operating level under control of a level of the first node; and
    the first bias control circuit is connected to a first clock signal terminal, a first reference voltage signal terminal, and the first node, and is configured to transmit a first reference voltage signal provided by the first reference voltage signal terminal to the first node under control of a first clock signal provided by the first clock signal terminal, thereby turning off the first control circuit by controlling the level of the first node in a non-display phase.

2. The shift register unit according to claim 1, further comprising a detection circuit, wherein the detection circuit is configured to provide a detection scanning signal to the corresponding gate line in the non-display phase, and the detection circuit comprises a detection output circuit, a second control circuit, and a second bias control circuit;
    the detection output circuit comprises a first control terminal and an output terminal, and the detection output circuit is connected to a second clock signal terminal, and is configured to output a second clock signal provided by the second clock signal terminal to the output terminal of the detection output circuit under control of a level of the first control terminal of the detection output circuit;
    the second control circuit is connected to a second node and the first control terminal of the detection output circuit, and is configured to control the level of the first control terminal of the detection output circuit under control of a level of the second node; and
    the second bias control circuit is connected to the first clock signal terminal, the first reference voltage signal terminal, and the second node, and is configured to transmit the first reference voltage signal to the second node under control of the first clock signal, thereby turning off the second control circuit by controlling the level of the second node in the non-display phase.

3. The shift register unit according to claim 2, wherein the first bias control circuit comprises a first transistor, the first control circuit comprises a second transistor and a third transistor, and the output terminal of the display circuit comprises a first signal output terminal and a second signal output terminal;
    a gate electrode of the first transistor is connected to the first clock signal terminal, a first electrode of the first transistor is connected to the first node, and a second electrode of the first transistor is connected to the first reference voltage signal terminal;
    a gate electrode of the second transistor is connected to the first node, a first electrode of the second transistor is connected to the second signal output terminal, and a second electrode of the second transistor is connected to the first clock signal terminal; and
    a gate electrode of the third transistor is connected to the first node, a first electrode of the third transistor is connected to the first signal output terminal, and a second electrode of the third transistor is connected to the first clock signal terminal.

4. The shift register unit according to claim 3, wherein the second bias control circuit comprises a fourth transistor, the second control circuit comprises a fifth transistor, and the detection output circuit comprises a sixth transistor;
    a gate electrode of the fourth transistor is connected to the first clock signal terminal, a first electrode of the fourth transistor is connected to the second node, and a second electrode of the fourth transistor is connected to the first reference voltage signal terminal;
    a gate electrode of the fifth transistor is connected to the second node, a first electrode of the fifth transistor is connected to a gate electrode of the sixth transistor, and a second electrode of the fifth transistor is connected to the first clock signal terminal; and
    the gate electrode of the sixth transistor serves as the first control terminal of the detection output circuit, a first electrode of the sixth transistor is connected to the second clock signal terminal, and a second electrode of the sixth transistor serves as the output terminal of the detection output circuit and is connected to the first signal output terminal.

5. The shift register unit according to claim 4, wherein the display circuit further comprises a display input circuit and a display output circuit;

the display input circuit is connected to a first input signal terminal, a third clock signal terminal, and a third node, and is configured to input a first input signal provided by the first input signal terminal to the third node in response to a third clock signal provided by the third clock signal terminal;

the display output circuit is connected to the third node and a fourth clock signal terminal, and is configured to output a fourth clock signal provided by the fourth clock signal terminal to the first signal output terminal and the second signal output terminal under control of a level of the third node; and the first bias control circuit is further connected to the third node, and is further configured to transmit the first reference voltage signal to the third node under control of the first clock signal.

6. The shift register unit according to claim 5, wherein the display input circuit comprises a seventh transistor, the first bias control circuit further comprises an eighth transistor, and the display output circuit comprises a ninth transistor, a tenth transistor, and a first capacitor;

a gate electrode of the seventh transistor is connected to the third clock signal terminal, a first electrode of the seventh transistor is connected to the first input signal terminal, and a second electrode of the seventh transistor is connected to the third node;

a gate electrode of the eighth transistor is connected to the first clock signal terminal, a first electrode of the eighth transistor is connected to the third node, and a second electrode of the eighth transistor is connected to the first reference voltage signal terminal;

a gate electrode of the ninth transistor is connected to the third node, a first electrode of the ninth transistor is connected to the fourth clock signal terminal, and a second electrode of the ninth transistor is connected to the second signal output terminal;

a gate electrode of the tenth transistor is connected to the third node, a first electrode of the tenth transistor is connected to the fourth clock signal terminal, and a second electrode of the tenth transistor is connected to the first signal output terminal; and a first electrode of the first capacitor is connected to the third node, and a second electrode of the first capacitor is connected to the second signal output terminal or the first signal output terminal.

7. The shift register unit according to claim 6, wherein the display circuit further comprises a third control circuit;

the third control circuit is connected to a seventh clock signal terminal, an eighth clock signal terminal, the first node, and the third node, and is configured to control the level of the first node under control of a level of the third node; and the first control circuit is further connected to the third node and the first reference voltage signal terminal, and is further configured to allow a level of the third node to be at the non-operating level under control of the level of the first node.

8. The shift register unit according to claim 7, wherein the first control circuit further comprises a seventeenth transistor, and the third control circuit comprises an eighteenth transistor, a nineteenth transistor, and a twentieth transistor;

a gate electrode of the seventeenth transistor is connected to the first node, a first electrode of the seventeenth transistor is connected to the third node, and a second electrode of the seventeenth transistor is connected to the first reference voltage signal terminal;

a gate electrode of the eighteenth transistor is connected to a first electrode of the eighteenth transistor, and is connected to the seventh clock signal terminal, and a second electrode of the eighteenth transistor is connected to the first node;

a gate electrode of the nineteenth transistor is connected to the third node, a first electrode of the nineteenth transistor is connected to the first node, and a second electrode of the nineteenth transistor is connected to the first reference voltage signal terminal;

a gate electrode of the twentieth transistor is connected to a first electrode of the twentieth transistor, and is connected to the eighth clock signal terminal, and a second electrode of the twentieth transistor is connected to the first node; and a phase of a signal at the seventh clock signal terminal is opposite to a phase of a signal at the eighth clock signal terminal.

9. The shift register unit according to claim 6, wherein the display circuit further comprises a first reset circuit; and the first reset circuit is connected to the third node, a first reset signal terminal, and the first reference voltage signal terminal, and is configured to reset the third node in response to a first reset signal provided by the first reset signal terminal.

10. The shift register unit according to claim 9, wherein the first reset circuit comprises a twenty-first transistor; and a gate electrode of the twenty-first transistor is connected to the first reset signal terminal, a first electrode of the twenty-first transistor is connected to the third node, and a second electrode of the twenty-first transistor is connected to the first reference voltage signal terminal.

11. The shift register unit according to claim 4, wherein the detection circuit further comprises a detection input circuit and an output control circuit;

the detection input circuit is connected to a second input signal terminal, a fifth clock signal terminal, and a fourth node, and is configured to input a second input signal provided by the second input signal terminal to the fourth node in response to a fifth clock signal provided by the fifth clock signal terminal;

the detection output circuit further comprises a second control terminal, and the detection output circuit is further connected to a second reference voltage signal terminal, and is further configured to output a second reference voltage signal provided by the second reference voltage signal terminal to the output terminal of the detection output circuit under control of a level of the second control terminal of the detection output circuit; and the output control circuit is connected to the fourth node, a sixth clock signal terminal, the first reference voltage signal terminal, and the second control terminal of the detection output circuit, and is configured to control the level of the second control terminal under control of a level of the fourth node.

12. The shift register unit according to claim 11, wherein the detection input circuit comprises an eleventh transistor, the output control circuit comprises a twelfth transistor, a thirteenth transistor, a fourteenth transistor, a fifteenth transistor, and a second capacitor, and the detection output circuit further comprises a sixteenth transistor;

a gate electrode of the eleventh transistor is connected to the fifth clock signal terminal, a first electrode of the eleventh transistor is connected to the second input signal terminal, and a second electrode of the eleventh transistor is connected to the fourth node;

a gate electrode of the twelfth transistor is connected to the fourth node, a first electrode of the twelfth transistor is connected to the sixth clock signal terminal, and a second electrode of the twelfth transistor is connected to the gate electrode of the sixth transistor;

a gate electrode of the thirteenth transistor is connected to a first electrode of the thirteenth transistor, and is connected to the sixth clock signal terminal, and a second electrode of the thirteenth transistor is connected to a fifth node;

a gate electrode of the fourteenth transistor is connected to the fourth node, a first electrode of the fourteenth transistor is connected to the fifth node, and a second electrode of the fourteenth transistor is connected to the first reference voltage signal terminal;

a gate electrode of the fifteenth transistor is connected to a first electrode of the fifteenth transistor, and is connected to the fifth clock signal terminal, and a second electrode of the fifteenth transistor is connected to the gate electrode of the sixth transistor;

a gate electrode of the sixteenth transistor serves as the second control terminal of the detection output circuit, and is connected to the fifth node, a first electrode of the sixteenth transistor is connected to the second electrode of the sixth transistor, and a second electrode of the sixteenth transistor is connected to the second reference voltage signal terminal; and a first electrode of the second capacitor is connected to the fourth node, and a second electrode of the second capacitor is connected to the gate electrode of the sixth transistor.

13. The shift register unit according to claim 12, wherein the detection circuit further comprises a fourth control circuit;

the fourth control circuit is connected to a seventh clock signal terminal, an eighth clock signal terminal, the second node, and the fourth node, and is configured to control the level of the second node under control of the level of the fourth node; and the second control circuit is further connected to the fourth node and the first reference voltage signal terminal, and is further configured to allow a level of the fourth node to be at the non-operating level under control of the level of the second node.

14. The shift register unit according to claim 13, wherein the second control circuit further comprises a twenty-second transistor, and the fourth control circuit comprises a twenty-third transistor, a twenty-fourth transistor, and a twenty-fifth transistor;

a gate electrode of the twenty-second transistor is connected to the second node, a first electrode of the twenty-second transistor is connected to the fourth node, and a second electrode of the twenty-second transistor is connected to the first reference voltage signal terminal;

a gate electrode of the twenty-third transistor is connected to the fourth node, a first electrode of the twenty-third transistor is connected to the second node, and a second electrode of the twenty-third transistor is connected to the first reference voltage signal terminal;

a gate electrode of the twenty-fourth transistor is connected to a first electrode of the twenty-fourth transistor, and is connected to the seventh clock signal terminal, and a second electrode of the twenty-fourth transistor is connected to the second node;

a gate electrode of the twenty-fifth transistor is connected to a first electrode of the twenty-fifth transistor, and is connected to the eighth clock signal terminal, and a second electrode of the twenty-fifth transistor is connected to the second node; and a phase of a signal at the seventh clock signal terminal is opposite to a phase of a signal at the eighth clock signal terminal.

15. The shift register unit according to claim 12, wherein the detection circuit further comprises a second reset circuit; and the second reset circuit is connected to the fourth node, a second reset signal terminal, and the first reference voltage signal terminal, and is configured to reset the fourth node in response to a second reset signal provided by the second reset signal terminal.

16. The shift register unit according to claim 15, wherein the second reset circuit comprises a twenty-sixth transistor, and the output control circuit further comprises a twenty-seventh transistor;

a gate electrode of the twenty-sixth transistor is connected to the second reset signal terminal, a first electrode of the twenty-sixth transistor is connected to the fourth node, and a second electrode of the twenty-sixth transistor is connected to the first reference voltage signal terminal; and a gate electrode of the twenty-seventh transistor is connected to a ninth clock signal terminal, a first electrode of the twenty-seventh transistor is connected to the fifth node, and a second electrode of the twenty-seventh transistor is connected to the first reference voltage signal terminal.

17. The shift register unit according to claim 1, wherein the first clock signal is a first level signal in the display phase, the first clock signal is a second level signal in the non-display phase, and the first level signal is different from the second level signal.

18. A method for driving the shift register unit according to claim 1, comprising:

in the display phase, the first control circuit allows the signal of the output terminal of the display circuit to be at the non-operating level under control of the level of the first node, and the first bias control circuit being turned off under control of the first clock signal; and in the non-display phase, the first bias control circuit being turned on under control of the first clock signal and transmitting the first reference voltage signal to the first node, thereby turning off the first control circuit.

19. A gate drive circuit, comprising the shift register unit according to claim 1.

20. A display device, comprising the gate drive circuit according to claim 19.

* * * * *